US012791867B2

(12) United States Patent
Hatsumi et al.

(10) Patent No.: US 12,791,867 B2
(45) Date of Patent: Nov. 10, 2026

(54) OPTICAL DEVICE AND ELECTRONIC DEVICE

(71) Applicant: Semiconductor Energy Laboratory Co., Ltd., Atsugi (JP)

(72) Inventors: Ryo Hatsumi, Hadano (JP); Hisao Ikeda, Zama (JP); Daiki Nakamura, Atsugi (JP); Takeya Hirose, Atsugi (JP); Yosuke Tsukamoto, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 225 days.

(21) Appl. No.: 18/716,664

(22) PCT Filed: Dec. 15, 2022

(86) PCT No.: PCT/IB2022/062262
§ 371 (c)(1),
(2) Date: Jun. 5, 2024

(87) PCT Pub. No.: WO2023/126740
PCT Pub. Date: Jul. 6, 2023

(65) Prior Publication Data

US 2025/0035946 A1 Jan. 30, 2025

(30) Foreign Application Priority Data

Dec. 28, 2021 (JP) ................................ 2021-214138

(51) Int. Cl.
*G02B 5/30* (2006.01)
*G02B 27/01* (2006.01)
(Continued)

(52) U.S. Cl.
CPC ......... *G02B 27/281* (2013.01); *G02B 5/3066* (2013.01); *G02B 27/0172* (2013.01); *H10K 59/90* (2023.02); *G02B 2027/0178* (2013.01)

(58) Field of Classification Search
CPC ................ G02B 27/281; G02B 5/3066; G02B 27/0172; G02B 2027/0178; G02B 27/28;
(Continued)

(56) References Cited

U.S. PATENT DOCUMENTS 5,953,985 A 9/1999 Kobayashi
6,094,242 A 7/2000 Yamanaka
(Continued)

FOREIGN PATENT DOCUMENTS

CN 102203660 A 9/2011
CN 110308559 A 10/2019
(Continued)

OTHER PUBLICATIONS

International Search Report (Application No. PCT/IB2022/062262) Dated Feb. 28, 2023.
(Continued)

*Primary Examiner* — Jennifer D. Carruth
(74) *Attorney, Agent, or Firm* — Eric J. Robinson; Robinson Intellectual Property Law Office, P.C.

(57) ABSTRACT

A thin optical device having high light utilization efficiency and a small electronic device including the optical device are provided. The thin optical device includes a reflective polarizing plate, a lens, and an optical rotator. The optical device can be a thin optical device that is small in overall length by rotation of the polarization plane of linearly polarized light with the optical rotator and utilization of properties of transmitting and reflecting light of the reflective polarizing plate. Furthermore, the optical device does not use a half mirror; thus, the optical device has a property of high light utilization efficiency, and the power consumption of the electronic device can be reduced and the reliability of the electronic device can be improved.

12 Claims, 19 Drawing Sheets

(51) Int. Cl.
*G02B 27/28* (2006.01)
*H10K 59/90* (2023.01)

(58) Field of Classification Search
CPC ........ G02B 5/30; G02B 27/02; G02B 27/283; G02B 27/286; H10K 59/90; H10K 59/8791
See application file for complete search history.

(56) References Cited

U.S. PATENT DOCUMENTS

| | | | | |
|---|---|---|---|---|
| 6,120,338 | A | 9/2000 | Hirano et al. | |
| 6,304,303 | B1 | 10/2001 | Yamanaka | |
| 7,399,991 | B2 | 7/2008 | Seo et al. | |
| 7,663,149 | B2 | 2/2010 | Seo et al. | |
| 8,299,553 | B2 | 10/2012 | Kawakami et al. | |
| 8,780,039 | B2 | 7/2014 | Gay et al. | |
| 10,297,649 | B2 | 5/2019 | Hirakata | |
| 10,890,776 | B1 | 1/2021 | Gao et al. | |
| 10,901,217 | B1 * | 1/2021 | Yoon | G02B 5/3058 |
| 11,630,290 | B2 | 4/2023 | Yun et al. | |
| 2002/0072139 | A1 | 6/2002 | Kashiwabara | |
| 2011/0148290 | A1 | 6/2011 | Oota | |
| 2011/0193814 | A1 | 8/2011 | Gay et al. | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2021/0294105 | A1 | 9/2021 | He et al. | |
| 2021/0318480 | A1 | 10/2021 | Hong et al. | |
| 2021/0364797 | A1 | 11/2021 | Hwang et al. | |
| 2023/0014360 | A1 | 1/2023 | Kimura et al. | |
| 2023/0296910 | A1 | 9/2023 | Hirose. et al. | |

FOREIGN PATENT DOCUMENTS

| | | | | |
|---|---|---|---|---|
| CN | 209496201 | U | | 10/2019 |
| CN | 211826725 | U | * | 10/2020 |
| CN | 213780542 | U | | 7/2021 |
| CN | 213934432 | U | | 8/2021 |
| EP | 0718645 | A | | 6/1996 |
| EP | 2350730 | A | | 8/2011 |
| GB | 2465786 | | | 6/2010 |
| JP | 08-327940 | A | | 12/1996 |
| JP | 2000-036385 | A | | 2/2000 |
| JP | 2002-324673 | A | | 11/2002 |
| JP | 2003-059663 | A | | 2/2003 |
| JP | 2008-098106 | A | | 4/2008 |
| JP | 2008-147072 | A | | 6/2008 |
| JP | 2008-251270 | A | | 10/2008 |
| JP | 2012-508392 | | | 4/2012 |
| JP | 2014-120218 | A | | 6/2014 |
| JP | 2014-135251 | A | | 7/2014 |
| JP | 2014-232568 | A | | 12/2014 |
| JP | 2015-115178 | A | | 6/2015 |
| JP | 2016-197494 | A | | 11/2016 |
| JP | 2019-179696 | A | | 10/2019 |
| JP | 2020-160305 | A | | 10/2020 |
| WO | WO-2010/061755 | | | 6/2010 |

OTHER PUBLICATIONS

Written Opinion (Application No. PCT/IB2022/062262) Dated Feb. 28, 2023.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power- Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

OPTICAL DEVICE AND ELECTRONIC DEVICE

TECHNICAL FIELD

One embodiment of the present invention relates to an optical device and an electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting device, a lighting device, a power storage device, a memory device, an imaging device, an operation method thereof, and a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display apparatus, an imaging device, or an electronic device includes a semiconductor device.

BACKGROUND ART

Goggle-type devices and glasses-type devices have been developed as electronic devices for virtual reality (VR), augmented reality (AR), and the like.

In addition, examples of a display apparatus that can be employed for a display panel include, typically, a display apparatus including a liquid crystal element and a display apparatus including an organic EL (Electro Luminescence) element, a light-emitting diode (LED), or the like.

A display apparatus including an organic EL element does not need a backlight that is necessary for a liquid crystal display apparatus; thus, a thin, lightweight, high-contrast, and low-power display apparatus can be achieved. Patent Document 1, for example, discloses an example of a display apparatus using an organic EL element.

REFERENCE

Patent Document

[Patent Document 1] Japanese Published Patent Application No. 2002-324673

SUMMARY OF THE INVENTION

Problems to be Solved by the Invention

An electronic device such as a goggles-type device and a glasses-type device is a kind of wearable device, and the electronic device is desirably made small and lightweight in order to improve portability and fit. Therefore, a thin optical device that is designed to have short focal length is used for such an electronic device.

However, a half mirror having low light utilization efficiency is used for the optical device, and the half mirror has been required to be used by increasing the luminance of the display apparatus. The increase in the luminance of the display apparatus results in an increase in power consumption and a decrease in reliability of a display device. Therefore, a thin optical device having high light utilization efficiency has been desired.

Therefore, one object of one embodiment of the present invention is to provide a thin optical device having high light utilization efficiency. Another object is to provide a small electronic device including the optical device. Another object is to provide an electronic device with low power consumption. Another object is to provide a novel electronic device.

Note that the description of these objects does not preclude the presence of other objects. Note that in one embodiment of the present invention, there is no need to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention relates to a thin optical device having high light utilization efficiency and an electronic device including the optical device.

One embodiment of the present invention is an optical device that includes a first reflective polarizing plate, a first lens, an optical rotator, a second reflective polarizing plate, and a second lens. The first reflective polarizing plate, the first lens, the optical rotator, the second reflective polarizing plate, and the second lens are placed in this order to have a region where they overlap each other. The first lens and the optical rotator are apart from each other.

A first surface of the first reflective polarizing plate can be attached to a first surface of the first lens.

A first surface of the optical rotator can be attached to a first surface of the second reflective polarizing plate. In addition, a second surface of the second reflective polarizing plate that is opposite to the first surface of the second reflective polarizing plate can be attached to a first surface of the second lens.

The first reflective polarizing plate can transmit first linearly polarized light and can reflect second linearly polarized light that is orthogonal to the first linearly polarized light. The second reflective polarizing plate can reflect third linearly polarized light obtained by 45° rotation of a polarization plane of the first linearly polarized light and can transmit fourth linearly polarized light that is orthogonal to the third linearly polarized light.

An optical rotation degree of the optical rotator can be 45°.

Each of the first lens and the second lens can be a convex lens.

A polarizing plate may be provided to face a second surface of the first reflective polarizing plate that is opposite to the first surface of the first reflective polarizing plate.

Another embodiment of the present invention is an electronic device that includes a display panel, a polarizing plate, a first reflective polarizing plate, a first lens, an optical rotator, a second reflective polarizing plate, and a second lens in a housing. The display panel, the polarizing plate, the first reflective polarizing plate, the first lens, the optical rotator, the second reflective polarizing plate, and the second lens are placed in this order to have a region where they overlap each other. The polarizing plate and the first reflective polarizing plate are placed to be apart from each other. The first lens and the optical rotator are placed to be apart from each other.

A display surface of the display panel can be attached to a first surface of the polarizing plate.

A first surface of the first reflective polarizing plate can be attached to a first surface of the first lens.

A first surface of the optical rotator can be attached to a first surface of the second reflective polarizing plate, and a second surface of the second reflective polarizing plate that is opposite to the first surface of the second reflective polarizing plate can be attached to a first surface of the second lens.

The polarizing plate can transmit first linearly polarized light. The first reflective polarizing plate can transmit the first linearly polarized light and can reflect second linearly polarized light that is orthogonal to the first linearly polarized light. The second reflective polarizing plate can reflect third linearly polarized light obtained by 45° rotation of a polarization plane of the first linearly polarized light and can transmit fourth linearly polarized light that is orthogonal to the third linearly polarized light.

An optical rotation degree of the optical rotator can be 45°.

Each of the first lens and the second lens can be a convex lens.

Effect of the Invention

One embodiment of the present invention can provide a thin optical device having high light utilization efficiency. Alternatively, a small electronic device including the optical device can be provided. Alternatively, an electronic device with low power consumption can be provided. Alternatively, a novel electronic device can be provided.

Note that the description of these effects does not preclude the presence of other effects. One embodiment of the present invention does not necessarily have all the effects. Other effects can be derived from the description of the specification, the drawings, and the claims.

MODE FOR CARRYING OUT THE INVENTION

Figure 1:
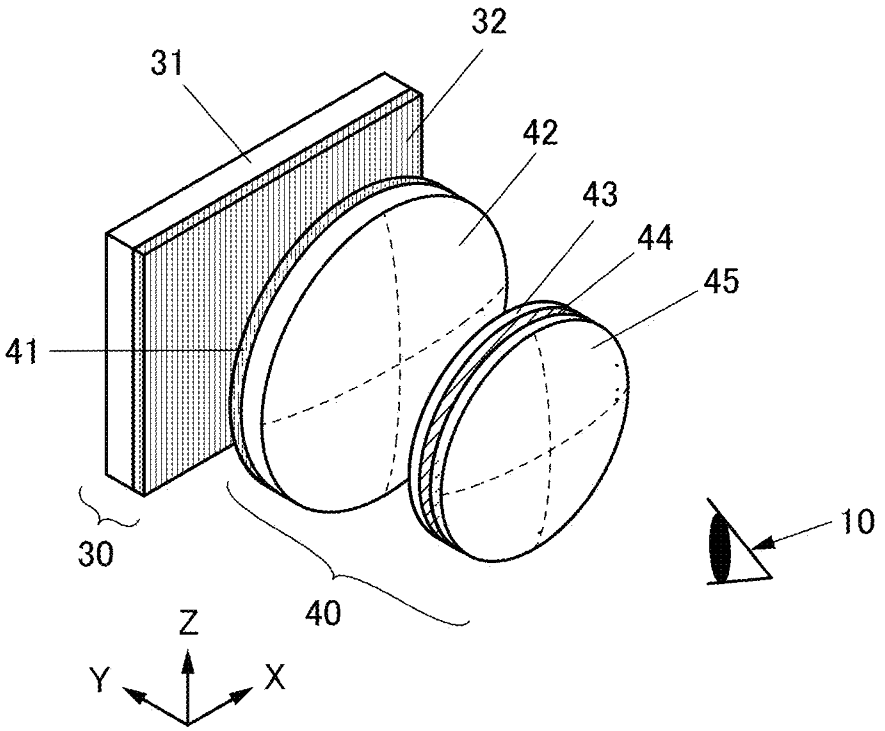
FIG. 1 illustrates a display apparatus and an optical device.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one or more conductors. In this specification, even such a structure is included in the category of direct connection.

Embodiment 1

In this embodiment, an optical device and an electronic device according to one embodiment of the present invention will be described.

One embodiment of the present invention is a thin optical device that includes a reflective polarizing plate, a lens, and an optical rotator. The optical device can be a thin optical device that is small in overall length by rotation of the polarization plane of linearly polarized light with the optical rotator and utilization of properties of transmitting and reflecting light of the reflective polarizing plate. Furthermore, the optical device according to one embodiment of the present invention does not use a half mirror; thus, the optical device has a property of high light utilization efficiency.

An electronic device such as a goggles-type device and a glasses-type device has a structure where a display apparatus and an optical device are combined in order to widen a viewing angle. With the use of the optical device according to one embodiment of the present invention for the electronic device, a small and thin electronic device with low power consumption and high reliability can be achieved.

Note that the optical device according to one embodiment of the present invention has a structure where a plurality of optical components are combined. A mechanism in which such a structure is included in a housing is simply referred to as a lens. Alternatively, the mechanism is referred to as a pancake lens in some cases because of its thin shape.

FIG. 1 is a perspective view illustrating a display apparatus and an optical device that can be used for the electronic device according to one embodiment of the present invention. A display apparatus 30 and an optical device 40 are placed to be apart from each other to have a region where they overlap each other.

A user can see an image displayed on the display apparatus 30 when bringing an eye 10 near the optical device 40. The user recognizes the image while a viewing angle is widened by the optical device 40, and thus can obtain sense of immersion and a realistic sensation.

The display apparatus 30 has a structure where a display panel 31 and a polarizing plate 32 are placed to have a region where they overlap each other. For example, as illustrated in FIG. 1, a structure where the polarizing plate 32 is attached to a display surface of the display panel 31 can be employed.

Note that the polarizing plate 32 is not necessarily a component of the display apparatus 30, and may be provided between the display apparatus 30 (the display panel 31) and the optical device 40. Alternatively, the polarizing plate 32 may be provided on the light incident surface side of the optical device 40 as a component of the optical device 40.

The optical device 40 has a region where a reflective polarizing plate 41, a lens 42, an optical rotator 43, a reflective polarizing plate 44, and a lens 45 overlap one another. Note that a first surface in the following description refers to one surface of each component, and a second surface refers to a surface opposite to the first surface.

For example, as illustrated in FIG. 1, a structure where a first surface of the reflective polarizing plate 41 is attached to a first surface of the lens 42 can be employed. Furthermore, a structure where a first surface of the reflective polarizing plate 44 is attached to a first surface of the optical rotator 43 and a first surface of the lens 45 is attached to a second surface of the reflective polarizing plate 44 can be employed. Note that a structure where these components are not attached to each other but are independently placed can be employed.

Note that in order to secure required optical path length, the lens 42 and the reflective polarizing plate 44 are preferably placed to be apart from each other. Therefore, in the case where the optical rotator 43 and the reflective polarizing plate 44 are attached to each other as described above, a second surface of the lens 42 and a second surface of the optical rotator 43 are preferably placed to be apart from each other.

Note that for the above attachment of one component to another component, it is possible to use an optical adhesive that has high transmittance with respect to the wavelength of light to be utilized (e.g., the wavelength range of visible light) and has no absorption of specified polarized light and no optical rotatory power with respect to specified polarized light. Alternatively, the other component may be formed on and in contact with the one component not by attachment but by a coating method or the like.

Figure 2A:
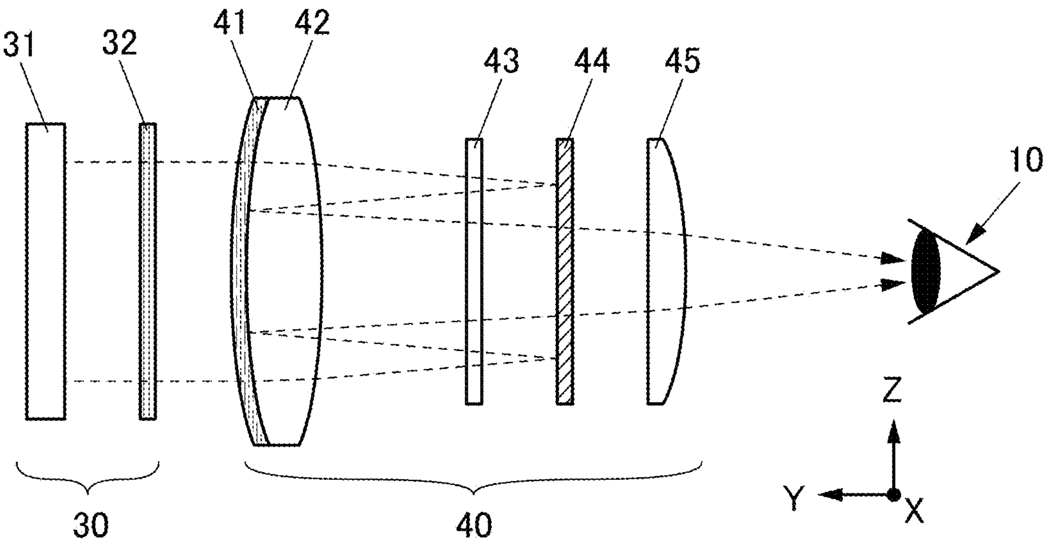
FIG. 2A and FIG. 2B are diagrams illustrating an optical device.

FIG. 2A is a diagram illustrating part of an optical path in the optical device according to one embodiment of the present invention, and the optical path is shown by a broken line. In addition, for clarity, some components that are illustrated as being in contact with each other in FIG. 1 are illustrated as being apart from each other. Note that the effect of one embodiment of the present invention can be obtained also by arranging the components as in FIG. 2A.

Part of light emitted from the display panel 31 passes through the polarizing plate 32, the reflective polarizing plate 41, the lens 42, and the optical rotator 43, and is reflected by the reflective polarizing plate 44. The light reflected by the reflective polarizing plate 44 passes through the optical rotator 43 and the lens 42, and is reflected again by the reflective polarizing plate 41. The light reflected by the reflective polarizing plate 41 passes through the lens 42, the optical rotator 43, the reflective polarizing plate 44, and the lens 45, and enters the eye 10.

By repeating reflection in this manner, the optical path length can be secured; thus, an optical system with short focal length can be achieved.

A liquid crystal panel including a liquid crystal element, an organic EL panel including an organic EL element, an LED panel including a micro LED, or the like can be used as the display panel 31. In particular, an organic EL panel is preferably used because a self-luminous and high-definition display portion is easily formed.

The linear polarizing plate 32 can extract one linearly polarized light from light oscillating in 360° all directions. Note that although a description is given in this embodiment under the assumption that the transmission axis of the polarizing plate 32 is 0°, 0° is not an absolute value but a reference value. That is, the polarization plane of the linearly polarized light extracted by the polarizing plate 32 is regarded as 0°. Accordingly, for example, 45° linearly polarized light refers to linearly polarized light obtained by rotating the polarization plane of the linearly polarized light extracted by the polarizing plate 32 by 45°.

Each of the reflective polarizing plates 41 and 44 can transmit linearly polarized light that coincides with the transmission axis, and can reflect linearly polarized light that is orthogonal to the transmission axis. For example, a wire grid polarizing plate, a dielectric multilayer film, or the like can be used as the reflective polarizing plate.

A convex lens can be used as each of the lenses 42 and 45. Although FIG. 2A illustrates an example where a biconvex lens is used as the lens 42 and a plano-convex lens is used as the lens 45, the lenses 42 and 45 are not limited thereto. For example, the lens 42 may be formed of a plurality of plano-convex lenses. In addition, a biconvex lens may be used as the lens 45. Alternatively, the lenses 42 and 45 can be formed by combining lenses selected from a biconvex lens, a plano-convex lens, a convex meniscus lens, and a concave meniscus lens. Furthermore, a lens other than the lenses 42 and 45 may be provided.

The optical rotator 43 makes it possible to emit incident linearly polarized light by rotation of the polarization plane of the linearly polarized light. In one embodiment of the present invention, an optical rotator whose optical rotation degree is 45° can be used as the optical rotator 43. A film-type cell filled with twisted nematic liquid crystals, a polymer liquid crystal film filled with twisted nematic liquid crystals, a Faraday rotator, or the like can be used for the optical rotator 43.

Figure 2B:
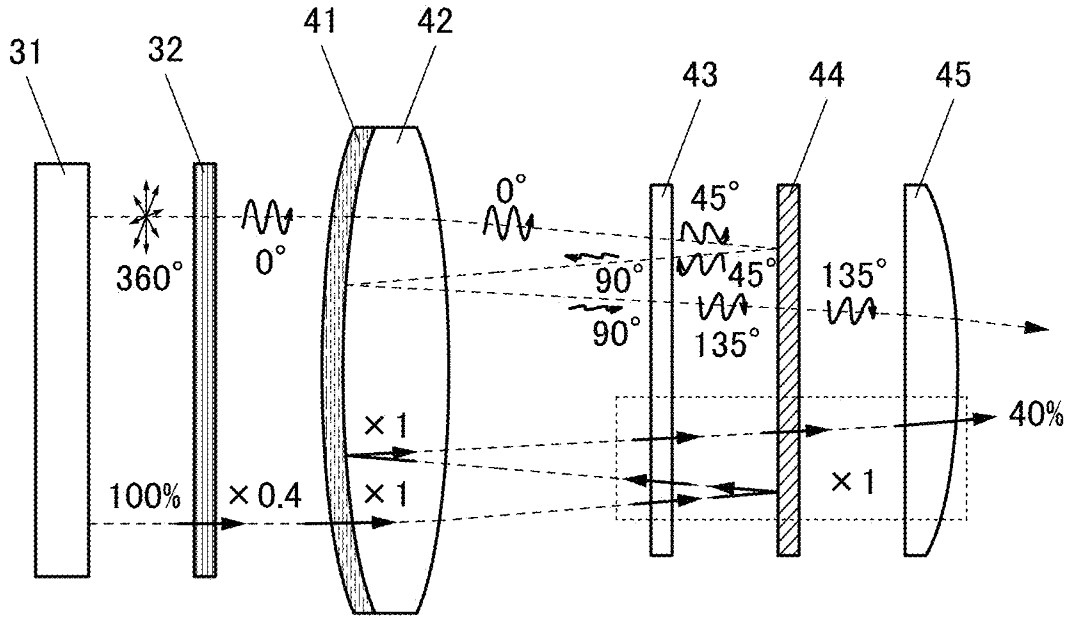

The details of a polarization state in the optical path of the optical device according to one embodiment of the present invention are described using FIG. 2B. Note that FIG. 2B is an enlarged view of the display apparatus 30 and the optical device 40 illustrated in FIG. 2A. An optical path on the upper side shows the polarization state, and an optical path on the lower side shows the efficiency of light transmission or reflection in each component.

Light oscillating in 360° all directions that is emitted from the display panel 31 enters the polarizing plate 32. The transmission axis of the polarizing plate 32 is 0°, and 0° linearly polarized light is emitted from the polarizing plate 32.

The 0° linearly polarized light that has been emitted from the polarizing plate 32 passes through the reflective polarizing plate 41 whose transmission axis is 0° and the lens 42, and enters the optical rotator 43. In the optical rotator 43, the polarization plane of the 0° linearly polarized light is rotated by 45° and 45° linearly polarized light is emitted.

The 45° linearly polarized light that has been emitted from the optical rotator 43 is reflected by the reflective polarizing plate 44 whose reflection axis is 45°, and enters again the optical rotator 43. In the optical rotator 43, the polarization plane of the 45° linearly polarized light is rotated by 45° and 90° linearly polarized light is emitted.

The 90° linearly polarized light that has been emitted from the optical rotator 43 is reflected by the reflective polarizing plate 41 whose reflection axis is 90°, and enters again the optical rotator 43. In the optical rotator 43, the polarization plane of the 90° linearly polarized light is rotated by 45° and 135° linearly polarized light is emitted.

The 135° linearly polarized light that has been emitted from the optical rotator 43 passes through the reflective polarizing plate 44 whose transmission axis is 135° and the lens 45. By using the linearly polarized light and the optical rotator in this manner, reflection and transmission by the reflective polarizing plates placed on the optical path can be selectively performed. Therefore, the optical path length can be secured in a limited space, and the focal length of the optical device can be shortened.

Next, light utilization efficiency is described. Note that the reflectance and transmittance of each component are typical values or ideal values.

When the amount of light emitted from the display panel 31 is set to be 100%, light emitted from the polarizing plate 32 is generally approximately 40% (×0.4) because the polarizing plate 32 absorbs light other than the 0° linearly polarized light.

After that, transmission and reflection are repeated in each component placed on the optical path, and light emitted from the lens 45 is ultimately approximately 40% because the transmittance and reflectance of each component are ideally 100% (×1). That is, it can be said that the optical device according to one embodiment of the present invention is an optical device having high light utilization efficiency because light loss in components other than the polarizing plate 32 is ideally 0.

Figure 3A:
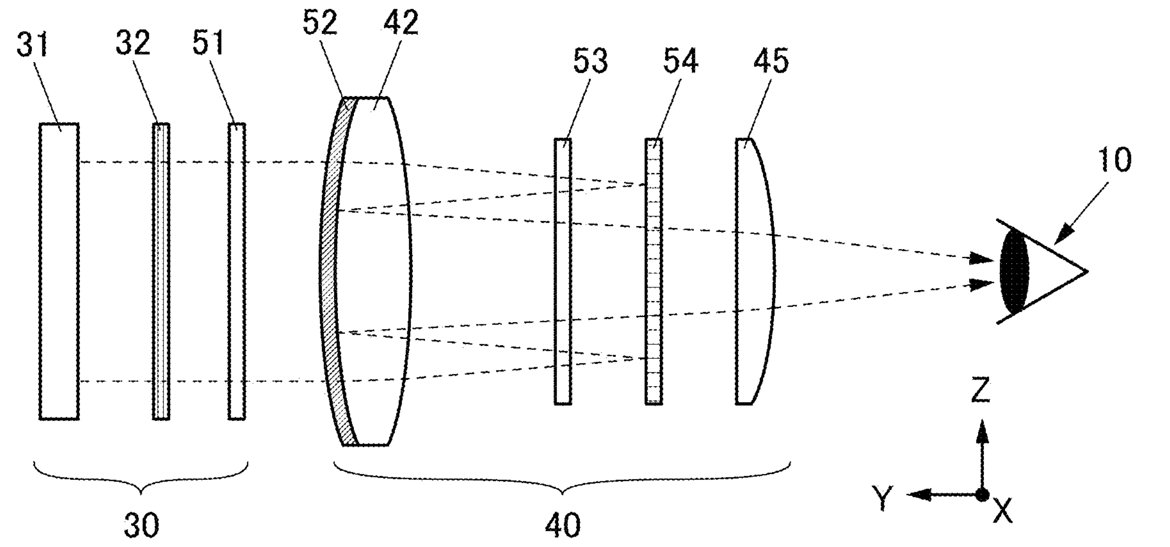
FIG. 3A and FIG. 3B are diagrams illustrating an optical device.

For comparison, FIG. 3A illustrates an example of a conventional optical device. Note that common components in FIG. 2A and FIG. 3A are denoted by the same reference numerals. The optical device illustrated in FIG. 3A is similar to the optical device in FIG. 2A in that optical path length is secured in a limited space by repeating reflection. The optical device illustrated in FIG. 3A differs from one embodiment of the present invention in that a retardation plate 51, a half mirror 52, a retardation plate 53, and a reflective polarizing plate 54 are used. Note that the reflective polarizing plate 54 differs from the reflective polarizing plate 44 in a reflection axis and a transmission axis.

Here, a λ/4 plate (a quarter-wave plate) is used as each of the retardation plates 51 and 53. When the 45° delay axis of the λ/4 plate overlaps the 0° transmission axis of the polarizing plate 32, dextrorotatory circularly polarized light is obtained. In addition, the reflection axis of the reflective polarizing plate 54 is 0°, and the transmission axis of the reflective polarizing plate 54 is 90°.

Figure 3B:
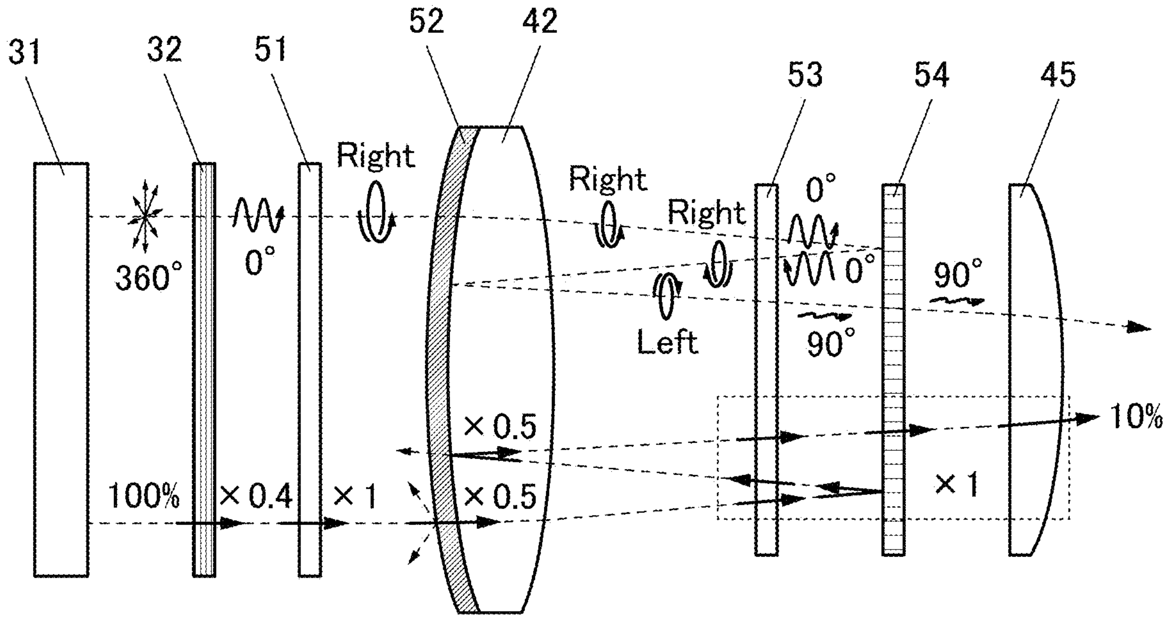

The details of a polarization state in the optical path of the conventional optical device are described using FIG. 3B. Note that FIG. 3B is an enlarged view of the display apparatus 30 and the optical device 40 illustrated in FIG. 3A. An optical path on the upper side shows the polarization state, and an optical path on the lower side shows the efficiency of light transmission or reflection in each component.

Light oscillating in 360° all directions that is emitted from the display panel 31 enters the polarizing plate 32. The transmission axis of the polarizing plate 32 is 0°, and 0° linearly polarized light is emitted from the polarizing plate 32.

The 0° linearly polarized light emitted from the polarizing plate 32 enters the retardation plate 51, and dextrorotatory circularly polarized light is emitted from the retardation plate 51.

The dextrorotatory circularly polarized light that has been emitted from the retardation plate 51 passes through the half mirror 52 and the lens 42, and enters the retardation plate 53. The dextrorotatory circularly polarized light that has entered the retardation plate 53 becomes 0° linearly polarized light and is emitted from the retardation plate 53.

The 0° linearly polarized light that has been emitted from the retardation plate 53 is reflected by the reflective polarizing plate 54 whose reflection axis is 0°, and enters again the retardation plate 53. The 0° linearly polarized light that has entered the retardation plate 53 becomes dextrorotatory circularly polarized light and is emitted from the retardation plate 53.

The dextrorotatory circularly polarized light that has been emitted from the retardation plate 53 is reflected by the half mirror 52, becomes levorotatory polarized light, and enters the retardation plate 53. The levorotatory polarized light that has entered the retardation plate 53 becomes 90° linearly polarized light and passes through the reflective polarizing plate 54 whose transmission axis is 90° and the lens 45.

Next, light utilization efficiency is described. When the amount of light emitted from the display panel 31 is set to be 100%, light emitted from the polarizing plate 32 is approximately 40% (×0.4) because the polarizing plate 32 absorbs light other than the 0° linearly polarized light.

In addition, since the transmittance of the retardation plate 51 is ideally 100% (×1), light emitted from the retardation plate 51 is approximately 40% (40%×1).

Next, the light emitted from the retardation plate 51 passes through the half mirror 52; however, its transmittance is approximately 50%, so that the amount of light after passing through the half mirror 52 is approximately 20% (40%×0.5).

The light that has passed through the half mirror 52 passes through the lens 42 and the retardation plate 53, is reflected by the reflective polarizing plate 54, passes through the retardation plate 53 and the lens 42, reaches again the half mirror 52, and is reflected by the half mirror 52. Here, when the transmittance of each of the lens 42 and the retardation plate 53 and the reflectance of the reflective polarizing plate 54 are each ideally set to be 100% (×1) and the reflectance of the half mirror 52 is set to be approximately 50%, the amount of light after being reflected by the half mirror is approximately 10% (20%×0.5).

After that, the light passes through each component placed on the optical path, and light emitted from the lens 45 is ultimately approximately 10% because the transmittance of each component is ideally 100% (×1). As described above, the light utilization efficiency of the optical device according to one embodiment of the present invention is approximately 40%, which means that the light utilization efficiency of the optical device according to one embodiment of the present invention is approximately four times as high as that of the conventional optical device.

In the conventional optical device, light loss due to the half mirror is particularly large. In the optical device according to one embodiment of the present invention, the reflective polarizing plate is used instead of the half mirror. The reflective polarizing plate makes it possible to have an ideal reflectance or transmittance of 100% with respect to linearly polarized light; thus, light loss can be made small.

In addition, the optical device according to one embodiment of the present invention does not use circularly polarized light but only uses linearly polarized light, so that it is possible to make the retardation plate unnecessary. Therefore, the number of optical components that constitute the optical device can be made smaller than that in the conventional optical device, so that the optical device and the electronic device can be manufactured at low cost.

FIG. 4A to FIG. 4D are diagrams each illustrating a modification example of the arrangement or modes of the polarizing plate 32, the reflective polarizing plate 41, and the lens 42.

Figure 4A:
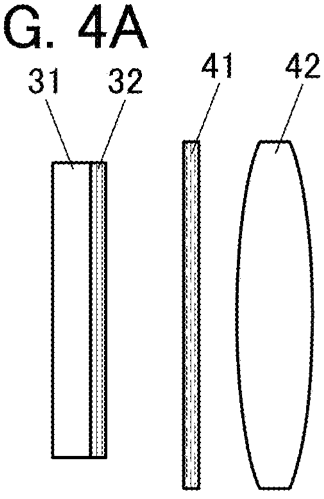
FIG. 4A to FIG. 4G are diagrams each illustrating an optical device.
Figure 4B:
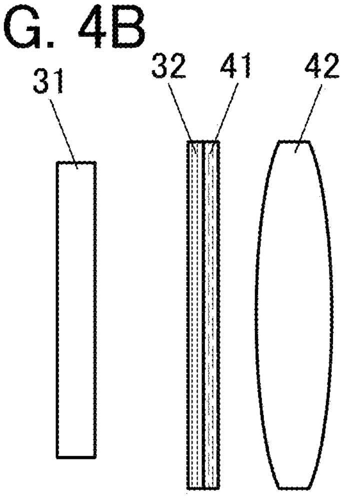

FIG. 4A is a diagram illustrating a modification example of the arrangement of the reflective polarizing plate 41. The reflective polarizing plate 41 may be apart from the lens 42 to be placed between the polarizing plate 32 and the lens 42. In addition, as illustrated in FIG. 4B, the polarizing plate 32 and the reflective polarizing plate 41 may be attached to each other to be placed between the display panel 31 and the lens 42.

Figure 4C:
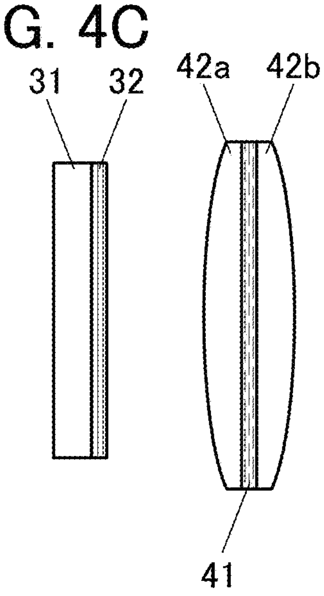
Figure 4D:
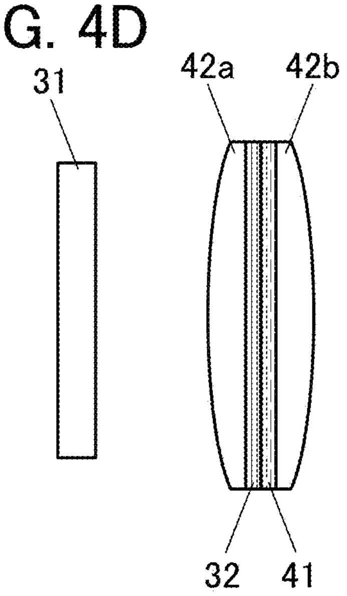

FIG. 4C is a diagram illustrating a structure where the lens 42 that is a biconvex lens has been replaced with two single convex lenses (lenses 42*a* and 42*b*). In that case, a structure where the reflective polarizing plate 41 is sandwiched between the lenses 42*a* and 42*b* can be employed. In addition, as illustrated in FIG. 4D, the polarizing plate 32 and the reflective polarizing plate 41 may be attached to each other to be sandwiched between the lenses 42*a* and 42*b*.

Figure 4E:
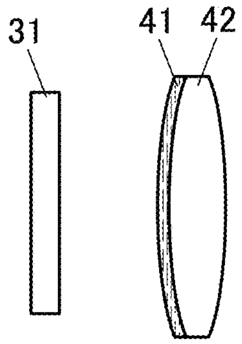
Figure 4F:
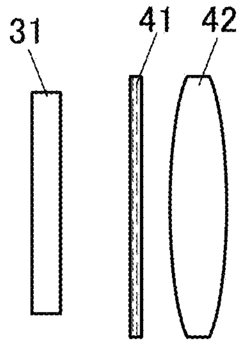
Figure 4G:
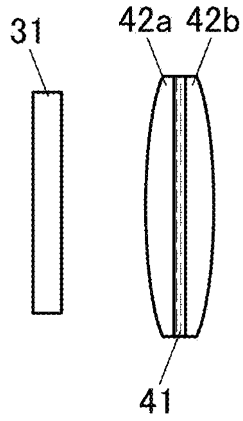

Note that as illustrated in FIG. 4E to FIG. 4G, a structure where the polarizing plate 32 is not provided can be employed. Since the polarizing plate 32 and the reflective polarizing plate 41 each transmit 0° polarized light, the polarizing plate 32 may be omitted.

Note that in the case where the polarizing plate 32 is not provided, when light reflected by the reflective polarizing plate 41 returns to the display panel 31 and goes again towards the reflective polarizing plate 41, the polarization state of part of the light collapses and the part of the light passes through the reflective polarizing plate 41 in some cases. Such light becomes stray light, which might decrease display quality. In the case where the polarizing plate 32 is provided, light that has passed through the polarizing plate 32 is not reflected by the reflective polarizing plate 41, so that stray light can be inhibited.

Figure 5A:
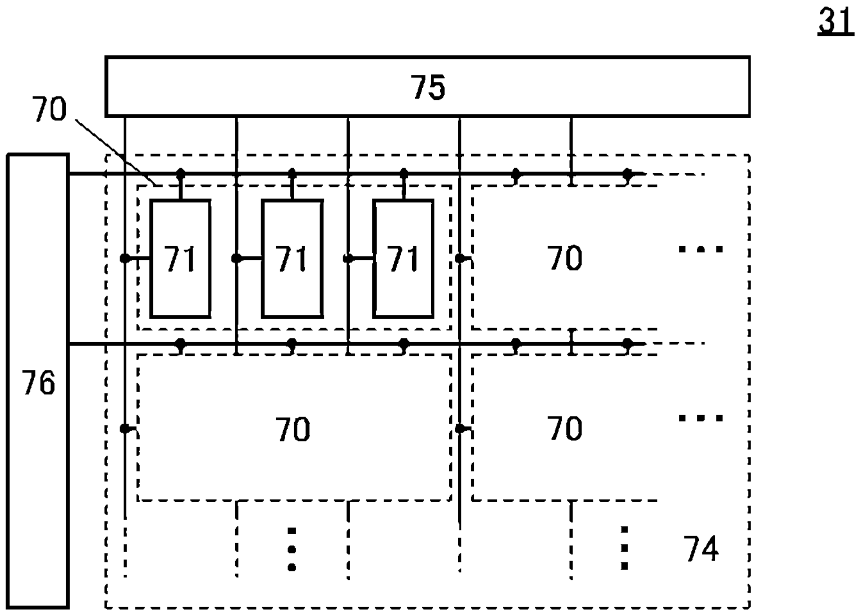
FIG. 5A to FIG. 5C are diagrams illustrating an electronic device.

FIG. 5A is a diagram illustrating the display panel 31 included in the electronic device according to one embodiment of the present invention. The display panel 31 includes a pixel array 74, a circuit 75, and a circuit 76. The pixel array 74 includes pixels 70 arranged in a column direction and a row direction.

The pixel 70 can include a plurality of subpixels 71. For example, the subpixel 71 has a function of emitting light for display.

Note that in this specification, although the minimum unit in which an independent operation is performed in one "pixel" is defined as a "subpixel" in the description for convenience, a "pixel" may be replaced with a "region" and a "subpixel" may be replaced with a "pixel."

The subpixel 71 includes a light-emitting device that emits visible light. An EL element such as an OLED (Organic Light Emitting Diode) or a QLED (Quantum-dot Light Emitting Diode) is preferably used as the light-emitting device. As a light-emitting substance contained in the EL element, a substance that emits fluorescent light (a fluorescent material), a substance that emits phosphorescent light (a phosphorescent material), a substance that exhibits thermally activated delayed fluorescence (a thermally activated delayed fluorescent (TADF) material), an inorganic compound (a quantum dot material or the like), and the like can be given. In addition, an LED (Light Emitting Diode) such as a micro LED can be also used as the light-emitting device.

The circuit 75 and the circuit 76 are driver circuits for driving the subpixel 71. The circuit 75 can have a function of a source driver circuit, and the circuit 76 can have a function of a gate driver circuit. A shift register circuit or the like can be used as each of the circuit 75 and the circuit 76, for example.

Figure 5B:
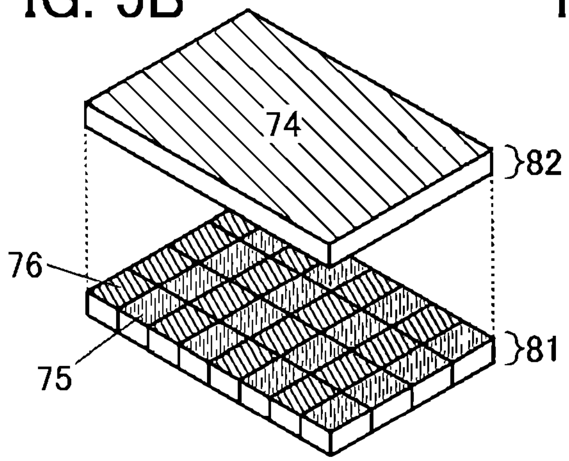

Note that as illustrated in FIG. 5B, a structure where the circuit 75 and the circuit 76 are provided in a layer 81, the pixel array 74 is provided in a layer 82, and the layer 81 and the layer 82 overlap each other may be employed. This structure enables a display apparatus with a narrow bezel to be formed.

In addition, when the driver circuits are provided below the pixel array 74, wiring length can be shortened and wiring capacitance can be reduced. Accordingly, a display panel capable of a high-speed operation with low power consumption can be provided.

In addition, when each of the circuit 75 and the circuit 76 is divided and placed as illustrated in FIG. 5B, part of the pixel array 74 can be driven. For example, part of image data in the pixel array 74 can be rewritten. Furthermore, part of the pixel array 74 can be operated at different operating frequency.

The layout and area of the circuit 75 and the circuit 76 illustrated in FIG. 5B are examples and can be changed as appropriate. In addition, parts of the circuit 75 and the circuit 76 can be formed in the same layer as the pixel array 74. Furthermore, a circuit such as a memory circuit, an arithmetic circuit, or a communication circuit may be provided in the layer 82.

In this structure, for example, a single crystal silicon substrate can be used for the layer 81, the circuit 75 and the circuit 76 can be formed with transistors including silicon in channel formation regions (hereinafter Si transistors), and pixel circuits included in the pixel array 74 provided in the layer 82 can be formed with transistors including a metal oxide in channel formation regions (hereinafter OS transistors). An OS transistor can be formed with a thin film and can be formed to be stacked over a Si transistor.

Figure 5C:
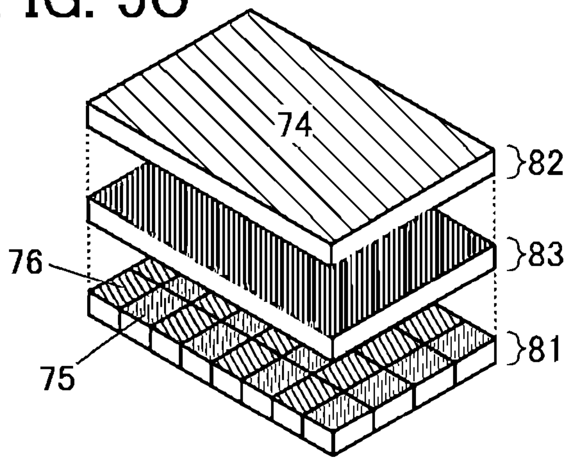

Note that as illustrated in FIG. 5C, a structure where a layer 83 including OS transistors is provided between the layer 81 and the layer 82 may be employed. Some of the pixel circuits included in the pixel array 74 in the layer 83 can be provided with OS transistors. Alternatively, some of the circuit 75 and the circuit 76 can be provided with OS transistors. Alternatively, some of the circuits that can be provided in the layer 82, such as a memory circuit, an arithmetic circuit, and a communication circuit, can be provided with OS transistors.

Figure 6A:
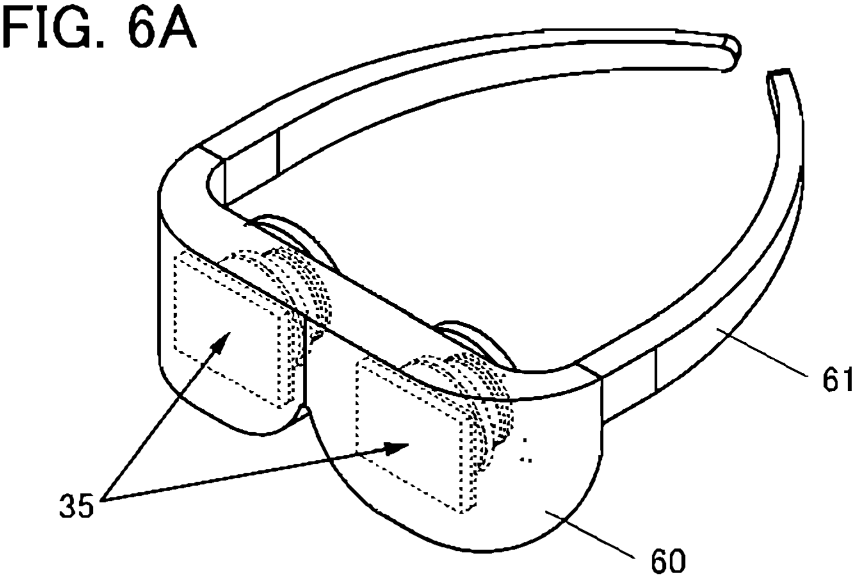
FIG. 6A and FIG. 6B are diagrams illustrating a glasses-type device.
Figure 6B:
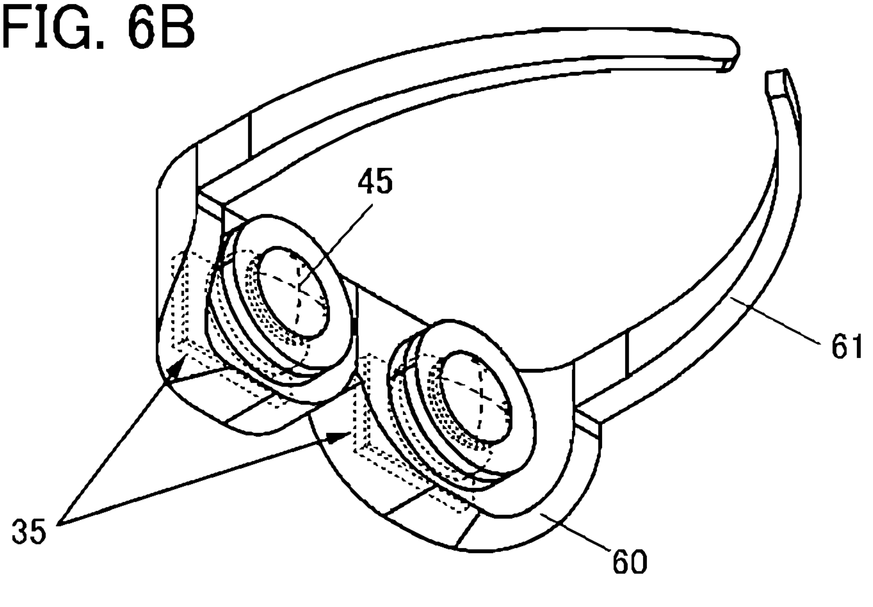

FIG. 6A and FIG. 6B are diagrams illustrating an example of a glasses-type device including the display apparatus 30 and the optical device 40 which are illustrated in FIG. 1. Here, a combination of the display apparatus 30 and the optical device 40 is denoted by broken lines as a display unit 35. The glasses-type device includes two display units 35 and is sometimes called VR glasses depending on the usage.

The two display units 35 are incorporated in a housing 60 so that surfaces of the lenses 45 are exposed on the inner side. One of the display units 35 is for a right eye, the other is for a left eye, and each of the display units 35 displays an image for the corresponding eye, so that a user can perceive the image as a three-dimensional image.

In addition, the housing 60 or a band 61 may be provided with an input terminal and an output terminal. To the input terminal, a cable for supplying a video signal from a video output device or the like, power for charging a battery provided in the housing 60, or the like can be connected. The output terminal can function as, for example, an audio output terminal to which earphones, headphones, or the like can be connected. Note that in the case where audio data can be output by wireless communication or sound is output from an external video output device, the audio output terminal is not necessarily provided.

In addition, a wireless communication module, a memory module, and the like may be provided inside the housing 60 or the band 61. Content to be watched can be downloaded via wireless communication using the wireless communication module and can be stored in the memory module. Accordingly, the user can watch the downloaded content offline whenever the user wants.

In addition, a sight line sensor may be provided in the housing 60. For example, operation buttons for power-on, power-off, sleep, volume control, channel change, menu display, selection, decision, and back, and operation buttons for play, stop, pause, fast forward, and rewinding of moving images are displayed and visually recognized, so that the respective operations can be performed.

With the use of the optical device 40 according to one embodiment of the present invention for the glasses-type device, a small and thin electronic device with low power consumption and high reliability can be achieved.

At least part of this embodiment can be implemented in combination with the other embodiments described in this specification as appropriate.

Embodiment 2

In this embodiment, structure examples of a display panel that can be employed for the electronic device according to one embodiment of the present invention will be described. A display panel described below as an example can be employed for the display panel 31 in Embodiment 1.

One embodiment of the present invention is a display panel including light-emitting elements (also referred to as light-emitting devices). The display panel includes two or more pixels of different emission colors. The pixels include light-emitting elements. The light-emitting elements each include a pair of electrodes and an EL layer therebetween. The light-emitting elements are preferably organic EL elements (organic electroluminescent elements). Two or more light-emitting elements of different emission colors include EL layers containing different light-emitting materials. For example, when three kinds of light-emitting elements that emit red (R), green (G), and blue (B) light are included, a full-color display panel can be achieved.

In the case of manufacturing a display panel including a plurality of light-emitting elements of different emission colors, layers (light-emitting layers) containing at least light-emitting materials each need to be formed in an island shape. In the case of separately forming some or all of EL layers, a method for forming an island-shaped organic film by an evaporation method using a shadow mask such as a metal mask is known. However, this method causes a deviation from the designed shape and position of the island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve the high definition and high aperture ratio of the display panel. In addition, the outline of the layer might blur during evaporation, so that the thickness of an end portion might be reduced. That is, the thickness of an island-shaped light-emitting layer might vary from place to place. In addition, in the case of manufacturing a display panel with a large size, high resolution, or high definition, a manufacturing yield might be reduced because of low dimensional accuracy of the metal mask and deformation due to heat or the like. Thus, a measure has been taken for a pseudo increase in definition (also referred to as pixel density) by employing a unique pixel arrangement such as a PenTile arrangement.

Note that in this specification and the like, the term "island shape" refers to a state where two or more layers formed using the same material in the same step are physically separated from each other. For example, the term "island-shaped light-emitting layer" refers to a state where the light-emitting layer and its adjacent light-emitting layer are physically separated from each other.

In one embodiment of the present invention, fine patterning of EL layers is performed by photolithography without using a shadow mask such as a fine metal mask (an FMM). Accordingly, it is possible to achieve a display panel with high definition and a high aperture ratio, which has been difficult to achieve. Moreover, since the EL layers can be formed separately, it is possible to achieve a display panel that performs extremely clear display with high contrast and high display quality. Note that, fine patterning of the EL layers may be performed using both a metal mask and photolithography, for example.

In addition, some or all of the EL layers can be physically divided from each other. This can inhibit leakage current flowing between adjacent light-emitting elements through a layer (also referred to as a common layer) shared by the light-emitting elements. Thus, it is possible to prevent crosstalk due to unintended light emission, so that a display panel with extremely high contrast can be achieved. In particular, a display panel having high current efficiency at low luminance can be achieved.

Note that in one embodiment of the present invention, the display panel can be also obtained by combining a light-emitting element that emits white light with a color filter. In that case, light-emitting elements having the same structure can be employed as light-emitting elements provided in pixels (subpixels) that emit light of different colors, which allows all the layers to be common layers. In addition, some or all of the EL layers may be divided from each other in a step using photolithography. Thus, leakage current through the common layer is inhibited; accordingly, a high-contrast display panel can be achieved. In particular, when an element has a tandem structure where a plurality of light-emitting layers are stacked with a highly conductive intermediate layer therebetween, leakage current through the intermediate layer can be effectively prevented, so that a display panel with high luminance, high definition, and high contrast can be achieved.

In the case where the EL layer is processed by a photolithography method, part of the light-emitting layer is sometimes exposed to cause degradation. Thus, an insulating layer covering at least a side surface of the island-shaped light-emitting layer is preferably provided. The insulating layer may cover part of a top surface of an island-shaped EL layer. For the insulating layer, a material having a barrier property against water and oxygen is preferably used. For example, an inorganic insulating film that is less likely to diffuse water or oxygen can be used. This can inhibit degradation of the EL layer and can achieve a highly reliable display panel.

Moreover, between two adjacent light-emitting elements, there is a region (a concave portion) where none of the EL layers of the light-emitting elements is provided. In the case where a common electrode or a common electrode and a common layer are formed to cover the concave portion, a phenomenon where the common electrode is divided by a step at an end portion of the EL layer (such a phenomenon is also referred to as disconnection) might occur, which might cause insulation of the common electrode over the EL layer. In view of this, a local gap between the two adjacent light-emitting elements is preferably filled with a resin layer (also referred to as local filling planarization, or LFP) functioning as a planarization film. The resin layer has a function of a planarization film. This structure can inhibit disconnection of the common layer or the common electrode and can achieve a highly reliable display panel.

More specific structure examples of the display panel according to one embodiment of the present invention will be described below with reference to drawings.

Structure Example 1

Figure 7A:
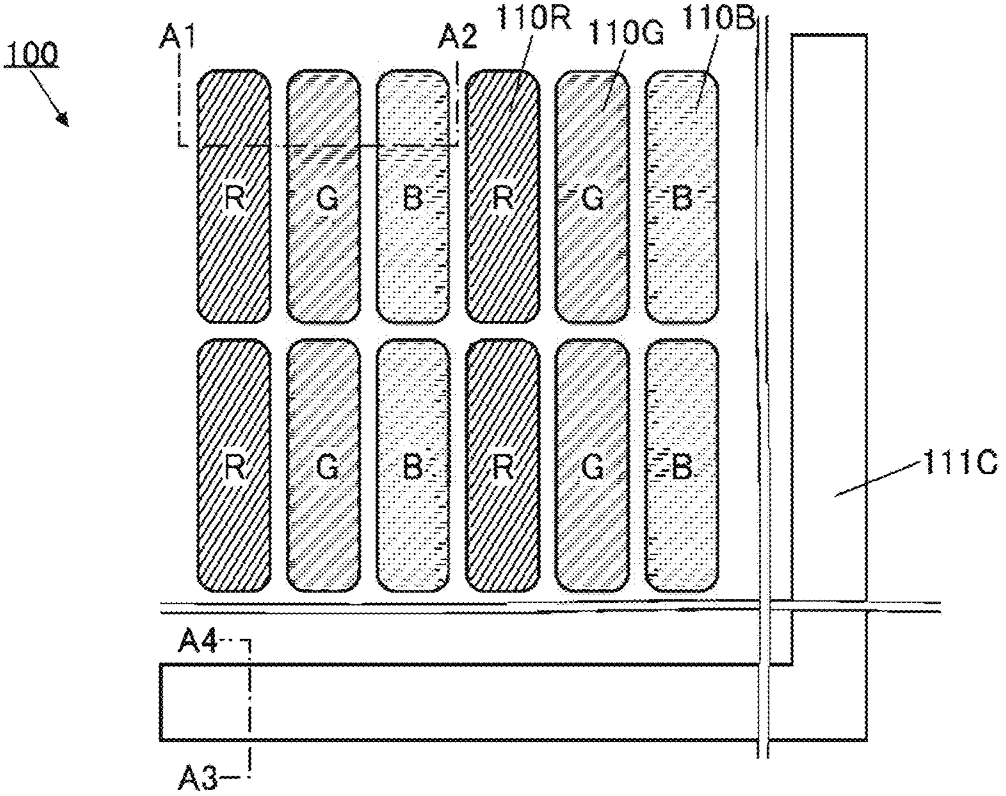
FIG. 7A to FIG. 7C are diagrams illustrating structure examples of a display panel.

FIG. 7A illustrates a schematic top view of a display panel 100 according to one embodiment of the present invention. The display panel 100 includes, over a substrate 101, a plurality of light-emitting elements 110R exhibiting red, a plurality of light-emitting elements 110G exhibiting green, and a plurality of light-emitting elements 110B exhibiting blue. In FIG. 7A, light-emitting regions of the light-emitting elements are denoted by R, G, and B to easily differentiate the light-emitting elements.

The light-emitting elements 110R, the light-emitting elements 110G, and the light-emitting elements 110B are each arranged in a matrix. FIG. 7A illustrates what is called a stripe arrangement, in which the light-emitting elements of the same color are arranged in one direction. Note that an arrangement method of the light-emitting elements is not limited thereto; an arrangement method such as an S-stripe arrangement, a delta arrangement, a Bayer arrangement, or a zigzag arrangement may be employed, or a PenTile arrangement, a diamond arrangement, or the like can be also used.

As each of the light-emitting elements 110R, the light-emitting elements 110G, and the light-emitting elements 110B, an OLED or a QLED is preferably used, for example. As a light-emitting substance contained in the EL element, a substance that emits fluorescent light (a fluorescent material), a substance that emits phosphorescent light (a phosphorescent material), and a substance that exhibits thermally activated delayed fluorescence (a thermally activated delayed fluorescent (TADF) material) can be given, for example. As the light-emitting substance contained in the EL element, not only an organic compound but also an inorganic compound (a quantum dot material or the like) can be used.

FIG. 7A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged.

The connection electrode 111C can be provided along the outer periphery of the display region. For example, the connection electrode 111C may be provided along one side of the outer periphery of the display region, or the connection electrode 111C may be provided across two or more sides of the outer periphery of the display region. That is, in the case where the display region has a rectangular top surface shape, the top surface shape of the connection electrode 111C can be a band shape (a rectangle), an L shape, a U shape (a square bracket shape), a quadrangular shape, or the like.

Figure 7B:
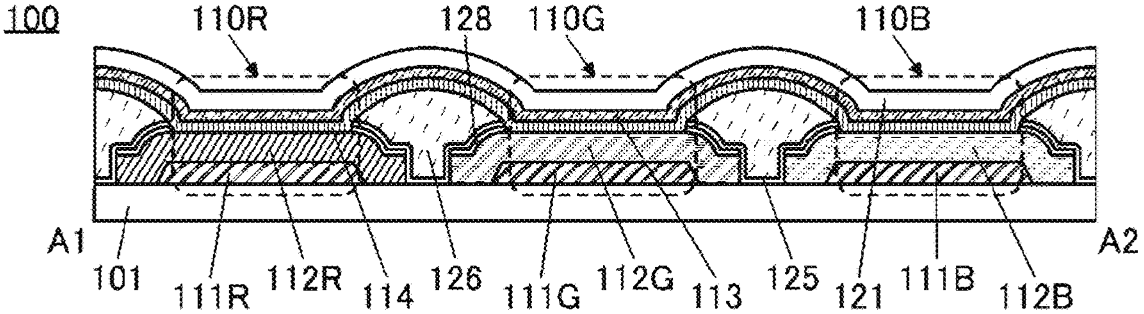
Figure 7C:
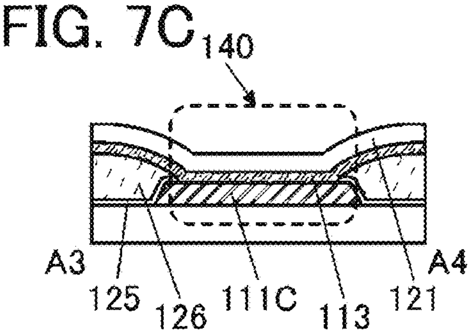

FIG. 7B and FIG. 7C are schematic cross-sectional views corresponding to the dashed-dotted line A1-A2 and the dashed-dotted line A3-A4 in FIG. 7A. FIG. 7B illustrates a schematic cross-sectional view of the light-emitting element 110R, the light-emitting element 110G, and the light-emitting element 110B, and FIG. 7C illustrates a schematic cross-sectional view of a connection portion 140 where the connection electrode 111C and the common electrode 113 are connected to each other.

The light-emitting element 110R includes a pixel electrode 111R, an organic layer 112R, a common layer 114, and the common electrode 113. The light-emitting element 110G includes a pixel electrode 111G, an organic layer 112G, the common layer 114, and the common electrode 113. The light-emitting element 110B includes a pixel electrode 111B, an organic layer 112B, the common layer 114, and the common electrode 113. The common layer 114 and the common electrode 113 are provided to be shared by the light-emitting element 110R, the light-emitting element 110G, and the light-emitting element 110B.

The organic layer 112R included in the light-emitting element 110R contains at least a light-emitting organic compound that emits red light. The organic layer 112G included in the light-emitting element 110G contains at least a light-emitting organic compound that emits green light. The organic layer 112B included in the light-emitting element 110B contains at least a light-emitting organic compound that emits blue light. Each of the organic layer 112R, the organic layer 112G, and the organic layer 112B can be also referred to as an EL layer and includes at least a layer containing a light-emitting substance (a light-emitting layer).

Hereinafter, the term "light-emitting element 110" is sometimes used to describe matters common to the light-emitting element 110R, the light-emitting element 110G, and the light-emitting element 110B. Similarly, in the description of matters common to components that are distinguished from each other using alphabets, such as the organic layer 112R, the organic layer 112G, and the organic layer 112B, reference numerals without alphabets are sometimes used.

The organic layer 112 and the common layer 114 can each independently include one or more of an electron-injection layer, an electron-transport layer, a hole-injection layer, and a hole-transport layer. For example, it is possible to employ a structure where the organic layer 112 includes a stacked-layer structure of a hole-injection layer, a hole-transport layer, a light-emitting layer, and an electron-transport layer from the pixel electrode 111 side and the common layer 114 includes an electron-injection layer.

The pixel electrode 111R, the pixel electrode 111G, and the pixel electrode 111B are provided for the respective light-emitting elements. In addition, the common electrode 113 and the common layer 114 are each provided as a continuous layer shared by the light-emitting elements. A conductive film having a property of transmitting visible light is used for either the pixel electrodes or the common electrode 113, and a conductive film having a reflective property is used for the other. When the pixel electrodes have light-transmitting properties and the common electrode 113 has a reflective property, a bottom-emission display panel can be obtained. In contrast, when the pixel electrodes have reflective properties and the common electrode 113 has a light-transmitting property, a top-emission display panel can be obtained. Note that when both the pixel electrodes and the common electrode 113 have light-transmitting properties, a dual-emission display panel can be also obtained.

A protective layer 121 is provided over the common electrode 113 to cover the light-emitting element 110R, the light-emitting element 110G, and the light-emitting element 110B. The protective layer 121 has a function of preventing diffusion of impurities such as water into each light-emitting element from the above.

An end portion of the pixel electrode 111 preferably has a tapered shape. In the case where the end portion of the pixel electrode 111 has a tapered shape, the organic layer 112 that is provided along the end portion of the pixel electrode 111 can also have a tapered shape. When the end portion of the pixel electrode 111 has a tapered shape, coverage with the organic layer 112 provided beyond the end portion of the pixel electrode 111 can be increased. Furthermore, when the side surface of the pixel electrode 111 has a tapered shape, a material (for example, also referred to as dust or particles) in a manufacturing step is easily removed by processing such as cleaning, which is preferable.

Note that in this specification and the like, a tapered shape indicates a shape in which at least part of a side surface of a structure is inclined to a substrate surface. For example, a tapered shape preferably includes a region where an angle formed between the inclined side surface and the substrate surface (such an angle is also referred to as a taper angle) is less than 90°.

The organic layer 112 is processed into an island shape by a photolithography method. Thus, an angle formed between a top surface and a side surface of an end portion of the organic layer 112 is approximately 90°. In contrast, an organic film formed using an FMM (Fine Metal Mask) or the like has a thickness that tends to gradually decrease with decreasing the distance from an end portion, and has a top surface forming a slope in an area extending in the range of greater than or equal to 1 μm and less than or equal to 10 μm, for example. Thus, such an organic film has a shape whose top surface and side surface are difficult to distinguish from each other.

An insulating layer 125, a resin layer 126, and a layer 128 are included between two adjacent light-emitting elements.

Between two adjacent light-emitting elements, side surfaces of the organic layers 112 are provided to face each other with the resin layer 126 therebetween. The resin layer 126 is positioned between the two adjacent light-emitting elements and is provided to fill end portions of the organic layers 112 and a region between the two organic layers 112. The resin layer 126 has a top surface with a smooth convex shape. The common layer 114 and the common electrode 113 are provided to cover the top surface of the resin layer 126.

The resin layer 126 functions as a planarization film that fills a step positioned between two adjacent light-emitting elements. Providing the resin layer 126 can prevent a phenomenon in which the common electrode 113 is divided by a step at an end portion of the organic layer 112 (such a phenomenon is also referred to as disconnection) from occurring and the common electrode over the organic layer 112 from being insulated. The resin layer 126 can be also referred to as LFP (Local Filling Planarization).

An insulating layer containing an organic material can be suitably used as the resin layer 126. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Alternatively, a photosensitive resin can be used for the resin layer 126. A photoresist may be used for the photosensitive resin. As the photosensitive resin, a positive photosensitive material or a negative photosensitive material can be used.

The resin layer 126 may contain a material absorbing visible light. For example, the resin layer 126 itself may be made of a material absorbing visible light, or the resin layer 126 may contain a pigment absorbing visible light. For example, for the resin layer 126, it is possible to use a resin that can be used as a color filter transmitting red, blue, or green light and absorbing other light, a resin that contains carbon black as a pigment and functions as a black matrix, or the like.

The insulating layer 125 is provided in contact with the side surfaces of the organic layers 112. In addition, the insulating layer 125 is provided to cover an upper end portion of the organic layer 112. Furthermore, part of the insulating layer 125 is provided in contact with a top surface of the substrate 101.

The insulating layer 125 is positioned between the resin layer 126 and the organic layer 112 and functions as a protective film for preventing contact between the resin layer 126 and the organic layer 112. When the organic layer 112 and the resin layer 126 are in contact with each other, the organic layer 112 might be dissolved by an organic solvent or the like used at the time of forming the resin layer 126. Therefore, the insulating layer 125 is provided between the organic layer 112 and the resin layer 126 to protect the side surfaces of the organic layer 112.

An insulating layer containing an inorganic material can be used for the insulating layer 125. For the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when a metal oxide film such as an aluminum oxide film or a hafnium oxide film or an inorganic insulating film such as a silicon oxide film that is formed by an ALD method is employed for the insulating layer 125, it is possible to form the insulating layer 125 that has a small number of pinholes and has an excellent function of protecting the EL layer.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 125, a sputtering method, a CVD method, a PLD method, an ALD method, or the like can be used. The insulating layer 125 is preferably formed by an ALD method that provides good coverage.

In addition, a structure may be employed in which a reflective film (e.g., a metal film containing one or more selected from silver, palladium, copper, titanium, aluminum, and the like) is provided between the insulating layer 125 and the resin layer 126 so that light emitted from the light-emitting layer is reflected by the reflective film. This can improve light extraction efficiency.

The layer 128 is a remaining part of a protective layer (also referred to as a mask layer or a sacrificial layer) for protecting the organic layer 112 during etching of the organic layer 112. For the layer 128, a material that can be used for the insulating layer 125 can be used. It is particularly preferable to use the same material for the layer 128 and the insulating layer 125 because an apparatus or the like for processing can be used in common.

In particular, since a metal oxide film such as an aluminum oxide film or a hafnium oxide film or an inorganic insulating film such as a silicon oxide film that is formed by an ALD method has a small number of pinholes, such a film has an excellent function of protecting the EL layer and can be suitably used for the insulating layer 125 and the layer 128.

The protective layer 121 can have, for example, a single-layer structure or a stacked-layer structure including at least an inorganic insulating film. Examples of the inorganic insulating film include an oxide film and a nitride film, such as a silicon oxide film, a silicon oxynitride film, a silicon nitride oxide film, a silicon nitride film, an aluminum oxide film, an aluminum oxynitride film, and a hafnium oxide film. Alternatively, a semiconductor material or a conductive material such as indium gallium oxide, indium zinc oxide, indium tin oxide, or indium gallium zinc oxide may be used for the protective layer 121.

For the protective layer 121, a stacked film of an inorganic insulating film and an organic insulating film can be used. For example, a structure where an organic insulating film is sandwiched between a pair of inorganic insulating films is preferable. Furthermore, the organic insulating film preferably functions as a planarization film. This enables a top surface of the organic insulating film to be flat, which results in improved coverage with the inorganic insulating film thereover and a higher barrier property. Moreover, the top surface of the protective layer 121 is flat; therefore, when a structural object (e.g., a color filter, an electrode of a touch sensor, a lens array, or the like) is provided above the protective layer 121, the structural object can be less affected by an uneven shape caused by a lower structure.

FIG. 7C illustrates the connection portion 140 in which the connection electrode 111C and the common electrode 113 are electrically connected to each other. In the connection portion 140, an opening portion is provided in the insulating layer 125 and the resin layer 126 over the connection electrode 111C. The connection electrode 111C and the common electrode 113 are electrically connected to each other in the opening portion.

Note that although FIG. 7C illustrates the connection portion 140 in which the connection electrode 111C and the common electrode 113 are electrically connected to each other, the common electrode 113 may be provided over the connection electrode 111C with the common layer 114 therebetween. Particularly in the case where a carrier-injection layer is used as the common layer 114, for example, a material used for the common layer 114 has sufficiently low electrical resistivity and the common layer 114 can be formed to be thin. Thus, problems do not arise in many cases even when the common layer 114 is positioned in the connection portion 140. Accordingly, the common electrode 113 and the common layer 114 can be formed using the same shielding mask, so that manufacturing cost can be reduced.

Structure Example 2

A display panel whose structure is partly different from that of Structure Example 1 is described below. Note that the above description can be referred to for portions common to those in Structure Example 1, and the description is omitted in some cases.

Figure 8A:
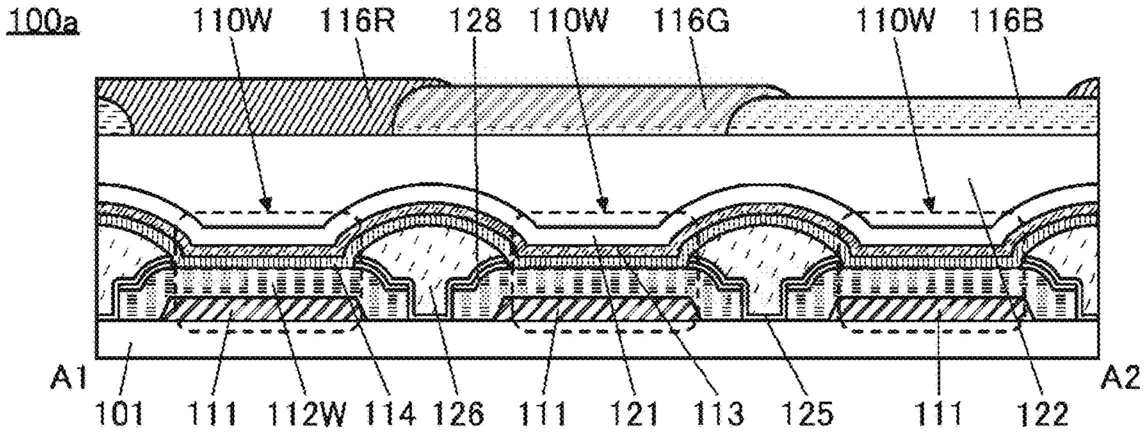
FIG. 8A and FIG. 8B are diagrams each illustrating a structure example of a display panel.

FIG. 8A is a schematic cross-sectional view of a display panel 100*a*. The display panel 100*a* is different from the display panel 100 mainly in the structure of the light-emitting element and including a coloring layer.

The display panel 100*a* includes light-emitting elements 110W that emit white light. The light-emitting elements 110W each include the pixel electrode 111, an organic layer 112W, the common layer 114, and the common electrode 113. The organic layer 112W emits white light. For example, the organic layer 112W can contain two or more kinds of light-emitting materials whose emission colors are complementary colors. For example, the organic layer 112W can contain a light-emitting organic compound that emits red light, a light-emitting organic compound that emits green light, and a light-emitting organic compound that emits blue light. Alternatively, the organic layer 112W may contain a light-emitting organic compound that emits blue light and a light-emitting organic compound that emits yellow light.

The organic layer 112W is divided between two adjacent light-emitting elements 110W. Thus, leakage current flowing between the adjacent light-emitting elements 110W through the organic layer 112W can be inhibited and crosstalk due to the leakage current can be inhibited. Accordingly, the display panel can achieve high contrast and high color reproducibility.

An insulating layer 122 that functions as a planarization film is provided over the protective layer 121, and a coloring layer 116R, a coloring layer 116G, and a coloring layer 116B are provided over the insulating layer 122.

An organic resin film or an inorganic insulating film with a flat top surface can be used for the insulating layer 122. The insulating layer 122 is a formation surface on which the coloring layer 116R, the coloring layer 116G, and the coloring layer 116B are formed. Thus, with a flat top surface of the insulating layer 122, the thickness of the coloring layer 116R or the like can be uniform and color purity can be increased. Note that when the thickness of the coloring layer 116R or the like is non-uniform, the amount of light absorption varies depending on a place in the coloring layer 116R, which might decrease the color purity.

Structure Example 3

Figure 8B:
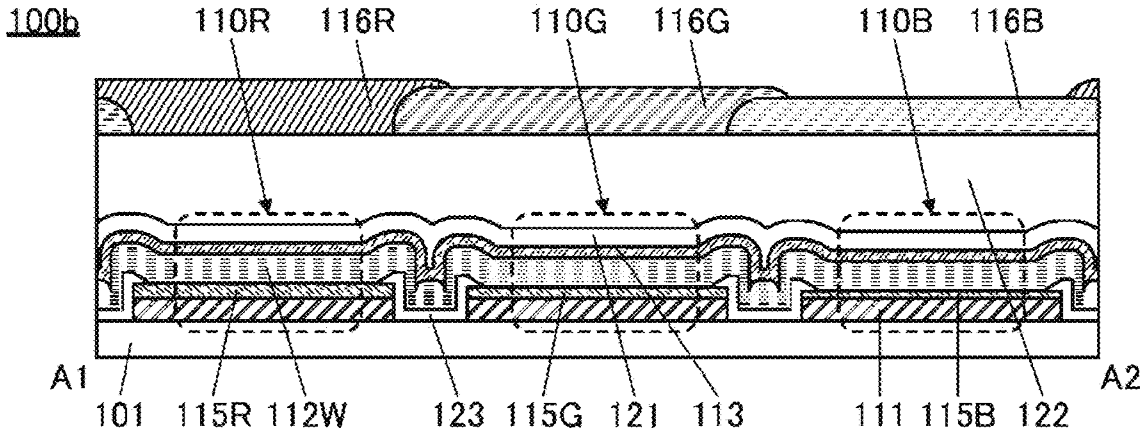

FIG. 8B is a schematic cross-sectional view of a display panel 100*b*.

The light-emitting element 110R includes the pixel electrode 111, a conductive layer 115R, the organic layer 112W, and the common electrode 113. The light-emitting element 110G includes the pixel electrode 111, a conductive layer 115G, the organic layer 112W, and the common electrode 113. The light-emitting element 110B includes the pixel electrode 111, a conductive layer 115B, the organic layer 112W, and the common electrode 113. The conductive layer 115R, the conductive layer 115G, and the conductive layer 115B each have a light-transmitting property and function as an optical adjustment layer.

A film that reflects visible light is used for the pixel electrode 111 and a film having a property of reflecting and transmitting visible light is used for the common electrode 113, so that a micro resonator (microcavity) structure can be achieved. In that case, by adjusting the thicknesses of the conductive layer 115R, the conductive layer 115G, and the conductive layer 115B to obtain optimal optical path length, light with different wavelengths and increased intensities can be obtained from the light-emitting element 110R, the light-emitting element 110G, and the light-emitting element 110B even when the organic layer 112 that emits white light is used.

Furthermore, the coloring layer 116R, the coloring layer 116G, and the coloring layer 116B are provided on the optical paths of the light-emitting element 110R, the light-emitting element 110G, and the light-emitting element 110B, respectively, so that light with high color purity can be obtained.

In addition, an insulating layer 123 that covers an end portion of the pixel electrode 111 and an end portion of an optical adjustment layer 115 is provided. An end portion of the insulating layer 123 preferably has a tapered shape. When the insulating layer 123 is provided, coverage with the organic layer 112W, the common electrode 113, the protective layer 121, and the like provided over the insulating layer 123 can be increased.

The organic layer 112W and the common electrode 113 are each provided as one continuous film shared by the light-emitting elements. Such a structure is preferable because the manufacturing process of the display panel can be greatly simplified.

Here, the end portion of the pixel electrode 111 preferably has a substantially vertical shape. Accordingly, a steep portion can be formed on the surface of the insulating layer 123, and thus a thin portion can be formed in part of the organic layer 112W that covers the steep portion or part of the organic layer 112W can be divided. Accordingly, leakage current generated between adjacent light-emitting elements through the organic layer 112W can be inhibited without processing the organic layer 112W by a photolithography method or the like.

The above is the description of the structure example of the display panel.

[Pixel Layout]

Pixel layout different from that in FIG. 7A will be mainly described below. There is no particular limitation on the arrangement of light-emitting elements (subpixels), and a variety of methods can be employed.

In addition, examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to a top surface shape of a light-emitting region of the light-emitting element.

Figure 9A:
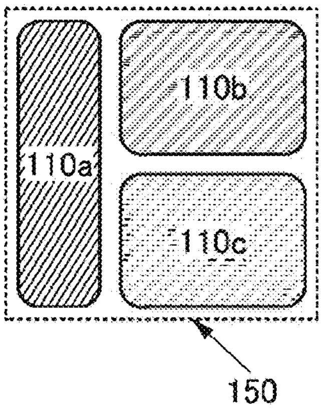
FIG. 9A to FIG. 9F are diagrams illustrating structure examples of a pixel.

A pixel 150 illustrated in FIG. 9A employs an S-stripe arrangement. The pixel 150 illustrated in FIG. 9A is composed of three subpixels: light-emitting elements 110*a*, 110*b*, and 110*c*. For example, the light-emitting element 110*a* may be a blue-light-emitting element, the light-emitting element 110*b* may be a red-light-emitting element, and the light-emitting element 110*c* may be a green-light-emitting element.

Figure 9B:
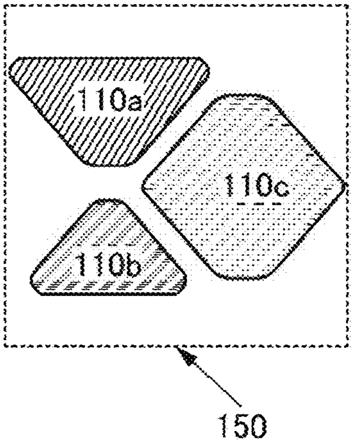

The pixel 150 illustrated in FIG. 9B includes the light-emitting element 110*a* whose top surface has a rough trapezoidal or rough triangle shape with rounded corners, the light-emitting element 110*b* whose top surface has a rough trapezoidal or rough triangle shape with rounded corners, and the light-emitting element 110*c* whose top surface has a rough tetragonal or rough hexagonal shape with rounded corners. In addition, the light-emitting element 110*a* has a larger light-emitting area than the light-emitting element 110*b*. In this manner, the shapes and sizes of the light-emitting elements can be independently determined. For example, the size of a light-emitting element with higher reliability can be made smaller. For example, the light-emitting element 110*a* may be a green light-emitting element, the light-emitting element 110*b* may be a red light-emitting element, and the light-emitting element 110*c* may be a blue light-emitting element.

Figure 9C:
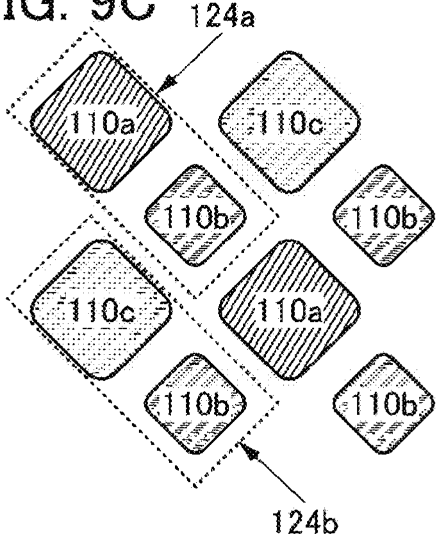

Pixels 124*a* and 124*b* illustrated in FIG. 9C employ a PenTile arrangement. FIG. 9C illustrates an example where the pixels 124*a* each including the light-emitting element 110*a* and the light-emitting element 110*b* and the pixels 124*b* each including the light-emitting element 110*b* and the light-emitting element 110*c* are alternately arranged. For example, the light-emitting element 110*a* may be a red light-emitting element, the light-emitting element 110*b* may be a green light-emitting element, and the light-emitting element 110*c* may be a blue light-emitting element.

Figure 9D:
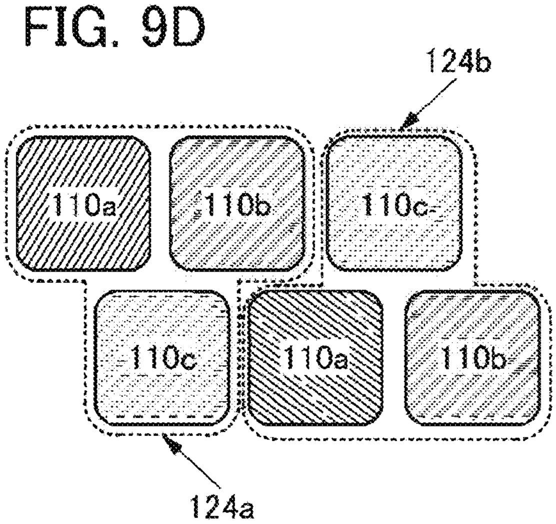
Figure 9E:
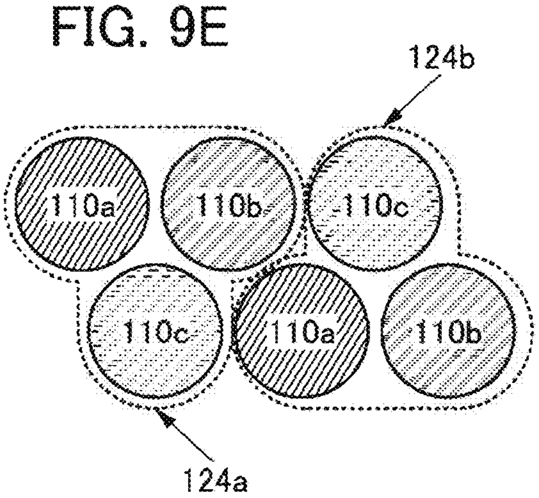

The pixels 124*a* and 124*b* illustrated in FIG. 9D and FIG. 9E employ a delta arrangement. The pixel 124*a* includes two light-emitting elements (the light-emitting elements 110*a* and 110*b*) in an upper row (a first row) and one light-emitting element (the light-emitting element 110*c*) in a lower row (a second row). The pixel 124*b* includes one light-emitting element (the light-emitting element 110*c*) in the upper row (the first row) and two light-emitting elements (the light-emitting elements 110*a* and 110*b*) in the lower row (the second row). For example, the light-emitting element 110*a* may be a red light-emitting element, the light-emitting element 110*b* may be a green light-emitting element, and the light-emitting element 110*c* may be a blue light-emitting element.

FIG. 9D illustrates an example where the top surface of each light-emitting element has a rough tetragonal shape with rounded corners, and FIG. 9E illustrates an example where the top surface of each light-emitting element is circular.

Figure 9F:
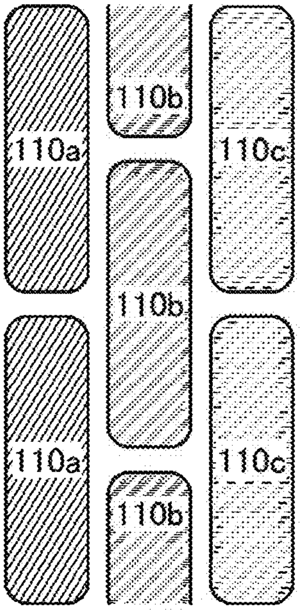

FIG. 9F illustrates an example where light-emitting elements of different colors are arranged in a zigzag manner. Specifically, the positions of top sides of two light-emitting elements arranged in a column direction (e.g., the light-emitting element 110*a* and the light-emitting element 110*b* or the light-emitting element 110*b* and the light-emitting element 110*c*) are not aligned in a top view. For example, the light-emitting element 110*a* may be a red light-emitting element, the light-emitting element 110*b* may be a green light-emitting element, and the light-emitting element 110*c* may be a blue light-emitting element.

In a photolithography method, as a pattern to be processed becomes finer, the influence of light diffraction becomes more difficult to ignore; accordingly, fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a light-emitting element has a polygonal shape with rounded corners, an elliptical shape, a circular shape, or the like in some cases.

Furthermore, in a method for manufacturing a display panel according to one embodiment of the present invention, the EL layer is processed into an island shape with the use of a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of a resist material. An insufficiently cured resist film might have a shape different from a desired shape at the time of processing. As a result, a top surface of the EL layer has a polygonal shape with rounded corners, an elliptical shape, a circular shape, or the like in some cases. For example, when a resist mask with a square top surface is intended to be formed, a resist mask with a circular top surface might be formed, and the top surface of the EL layer might be circular.

Note that to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

The above is the description of the pixel layout.

At least part of this embodiment can be implemented in combination with the other embodiments described in this specification as appropriate.

Embodiment 3

In this embodiment, other structure examples of a display panel that can be employed for the electronic device according to one embodiment of the present invention will be described.

Display panels in this embodiment are high-definition display panels. In particular, the display panels in this embodiment are suitably used for display portions of wearable devices that can be worn on a head, such as VR devices like head-mounted displays and glasses-type AR devices.

[Display Module]

Figure 10A:
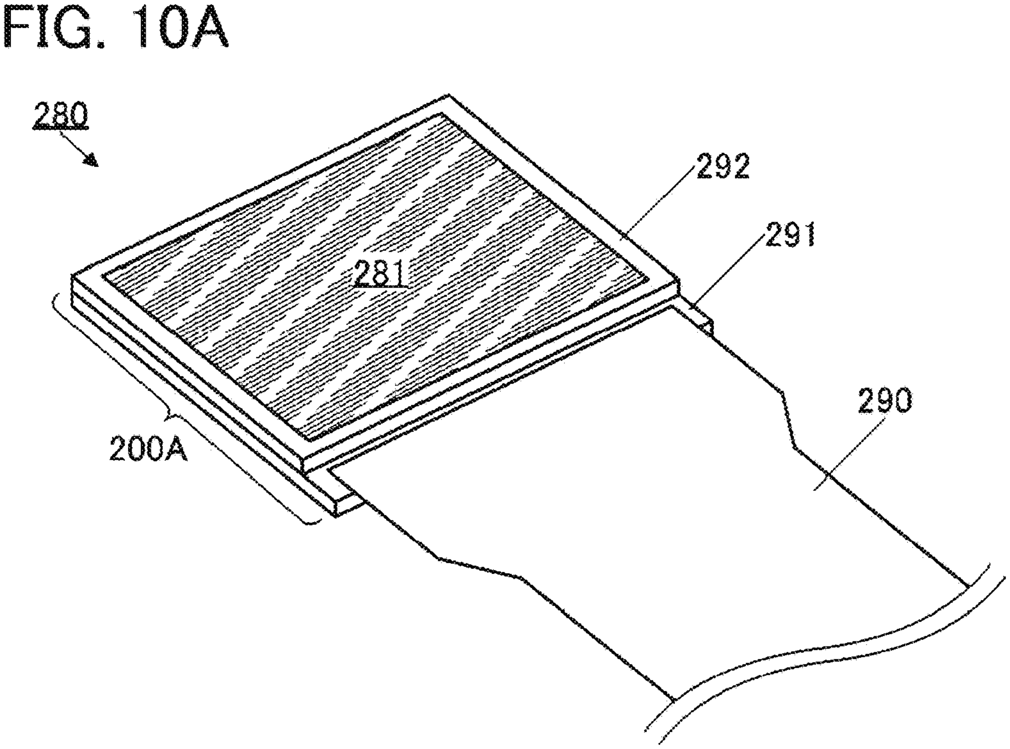
FIG. 10A and FIG. 10B are diagrams each illustrating a structure example of a display panel.

FIG. 10A is a perspective view of a display module 280. The display module 280 includes a display panel 200A and an FPC 290. Note that a display panel included in the display module 280 is not limited to the display panel 200A and may be any of a display panel 200B to a display panel 200F described later.

The display module 280 includes a substrate 291 and a substrate 292. The display module 280 includes a display portion 281. The display portion 281 is a region where an image is displayed.

Figure 10B:
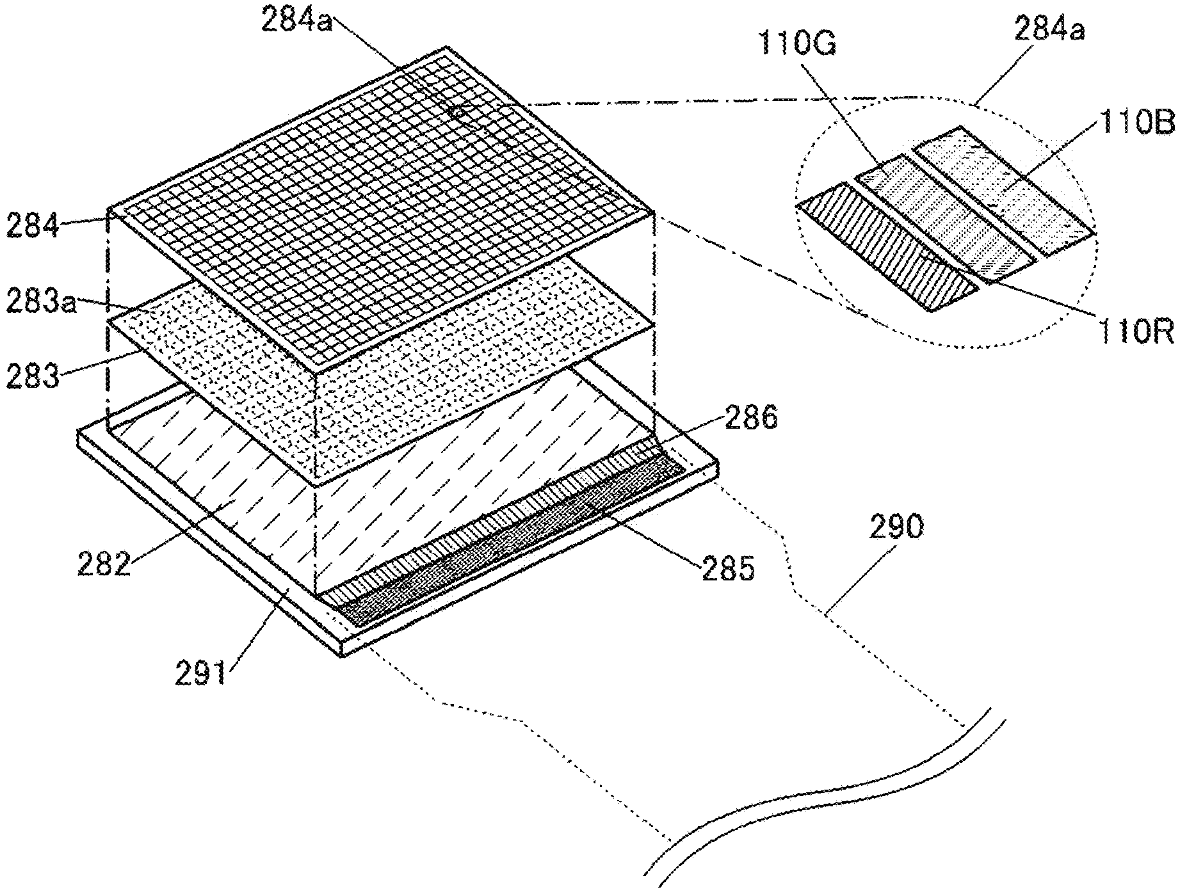

FIG. 10B is a perspective view schematically illustrating a structure on the substrate 291 side. Over the substrate 291, a circuit portion 282, a pixel circuit portion 283 over the circuit portion 282, and a pixel portion 284 over the pixel circuit portion 283 are stacked. In addition, a terminal portion 285 to be connected to the FPC 290 is provided in a portion over the substrate 291 that does not overlap the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 10B. The pixel 284*a* includes the light-emitting element 110R that emits red light, the light-emitting element 110G that emits green light, and the light-emitting element 110B that emits blue light.

The pixel circuit portion 283 includes a plurality of pixel circuits 283*a* arranged periodically. One pixel circuit 283*a* is a circuit for controlling light emission of three light-emitting devices included in one pixel 284*a*. One pixel circuit 283*a* may be provided with three circuits for controlling light emission of one light-emitting device. For example, the pixel circuit 283*a* can include at least one selection transistor, one current control transistor (driving transistor), and a capacitor for one light-emitting device. In that case, a gate signal is input to a gate of the selection transistor, and a source signal is input to a source of the selection transistor. Thus, an active-matrix display panel is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may further include at least one of an arithmetic circuit, a memory circuit, a power supply circuit, and the like. In addition, a transistor provided in the circuit portion 282 may constitute part of the pixel circuit 283*a*. That is, the pixel circuit 283*a* may be constituted by a transistor included in the pixel circuit portion 283 and a transistor included in the circuit portion 282.

The FPC 290 functions as a wiring for supplying a video signal, a power supply potential, and the like to the circuit portion 282 from the outside. In addition, an IC may be mounted on the FPC 290.

The display module 280 can have a structure where one or both of the pixel circuit portion 283 and the circuit portion 282 are provided to be stacked below the pixel portion 284; thus, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high definition. For example, the pixels 284*a* are preferably arranged in the display portion 281 with a definition higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high definition, and thus can be suitably used for a VR device such as a head-mounted display or a glasses-type AR device. For example, even in the case of a structure where the display portion of the display module 280 is seen through a lens, pixels of the extremely-high-definition display portion 281 included in the display module 280 are not seen even when the display portion is enlarged by the lens, so that display providing a high sense of immersion can be performed. Without being limited thereto, the display module 280 can be also suitably used for an electronic device having a comparatively small display portion. For example, the display module 280 can be suitably used for a display portion of a wearable electronic device, such as a wristwatch.

[Display Panel 200A]

Figure 11:
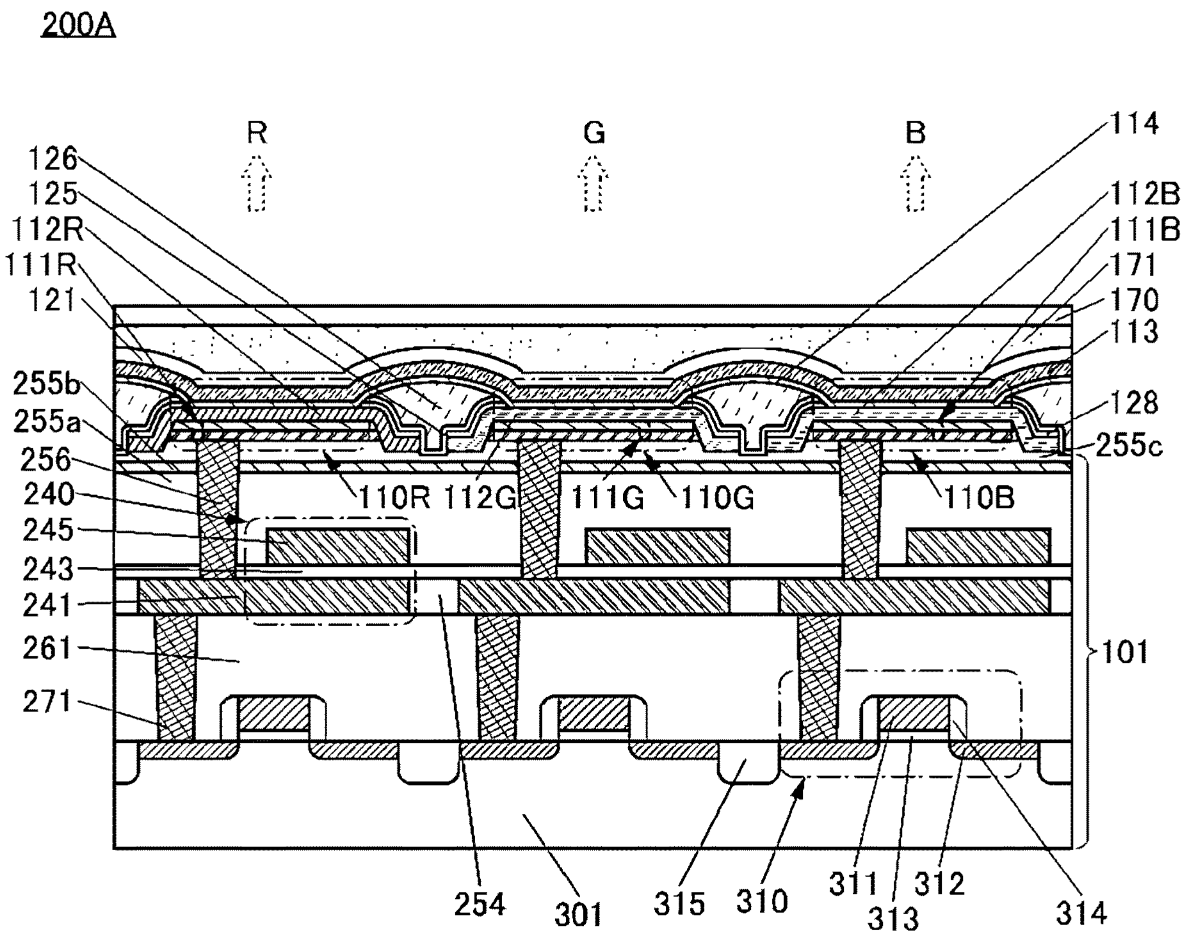
FIG. 11 is a diagram illustrating a structure example of a display panel.

The display panel 200A illustrated in FIG. 11 includes a substrate 301, the light-emitting elements 110R, 110G, and 110B, capacitors 240, and transistors 310.

The substrate 301 corresponds to the substrate 291 in FIG. 10A and FIG. 10B.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and insulating layers 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layers 314 are provided to cover side surfaces of the conductive layer 311.

In addition, an element isolation layer 315 is provided between two adjacent transistors 310 to be embedded in the substrate 301.

Furthermore, an insulating layer 261 is provided to cover the transistors 310, and the capacitors 240 are provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255*a* is provided to cover the capacitor 240. An insulating layer 255*b* is provided over the insulating layer 255*a*. An insulating layer 255*c* is provided over the insulating layer 255*b*.

An inorganic insulating film can be suitably used for each of the insulating layer 255*a*, the insulating layer 255*b*, and the insulating layer 255*c*. For example, it is preferable that a silicon oxide film be used for each of the insulating layer 255*a* and the insulating layer 255*c* and that a silicon nitride film be used for the insulating layer 255*b*. This enables the insulating layer 255*b* to function as an etching protective film. Although this embodiment shows an example where the insulating layer 255*c* is partly etched and a concave portion is formed, the concave portion is not necessarily provided in the insulating layer 255*c*.

The light-emitting element 110R, the light-emitting element 110G, and the light-emitting element 110B are provided over the insulating layer 255*c*. Embodiment 1 can be referred to for the structures of the light-emitting element 110R, the light-emitting element 110G, and the light-emitting element 110B.

In the display panel 200A, since the light-emitting devices of different colors are separately formed, a change in chromaticity between light emission at low luminance and light emission at high luminance is small. Furthermore, since the organic layers 112R, 112G, and 112B are apart from each other, crosstalk generated between adjacent subpixels can be inhibited while the display panel has high definition. It is thus possible to achieve a display panel that has high definition and high display quality.

In a region between adjacent light-emitting elements, the insulating layer 125, the resin layer 126, and the layer 128 are provided.

The pixel electrode 111R, the pixel electrode 111G, and the pixel electrode 111B of the light-emitting elements are each electrically connected to one of the source and the drain of the transistor 310 through a plug 256 that is embedded in the insulating layer 255*a*, the insulating layer 255*b*, and the insulating layer 255*c*, the conductive layer 241 that is embedded in the insulating layer 254, and the plug 271 that is embedded in the insulating layer 261. A top surface of the insulating layer 255*c* and a top surface of the plug 256 are level with or substantially level with each other. A variety of conductive materials can be used for the plugs.

In addition, the protective layer 121 is provided over the light-emitting elements 110R, 110G, and 110B. A substrate 170 is attached onto the protective layer 121 with an adhesive layer 171.

An insulating layer covering an end portion of a top surface of the pixel electrode 111 is not provided between two adjacent pixel electrodes 111. Thus, the distance between adjacent light-emitting elements can be extremely narrowed. Accordingly, the display panel can have high definition or high resolution.

[Display Panel 200B]

Figure 12:
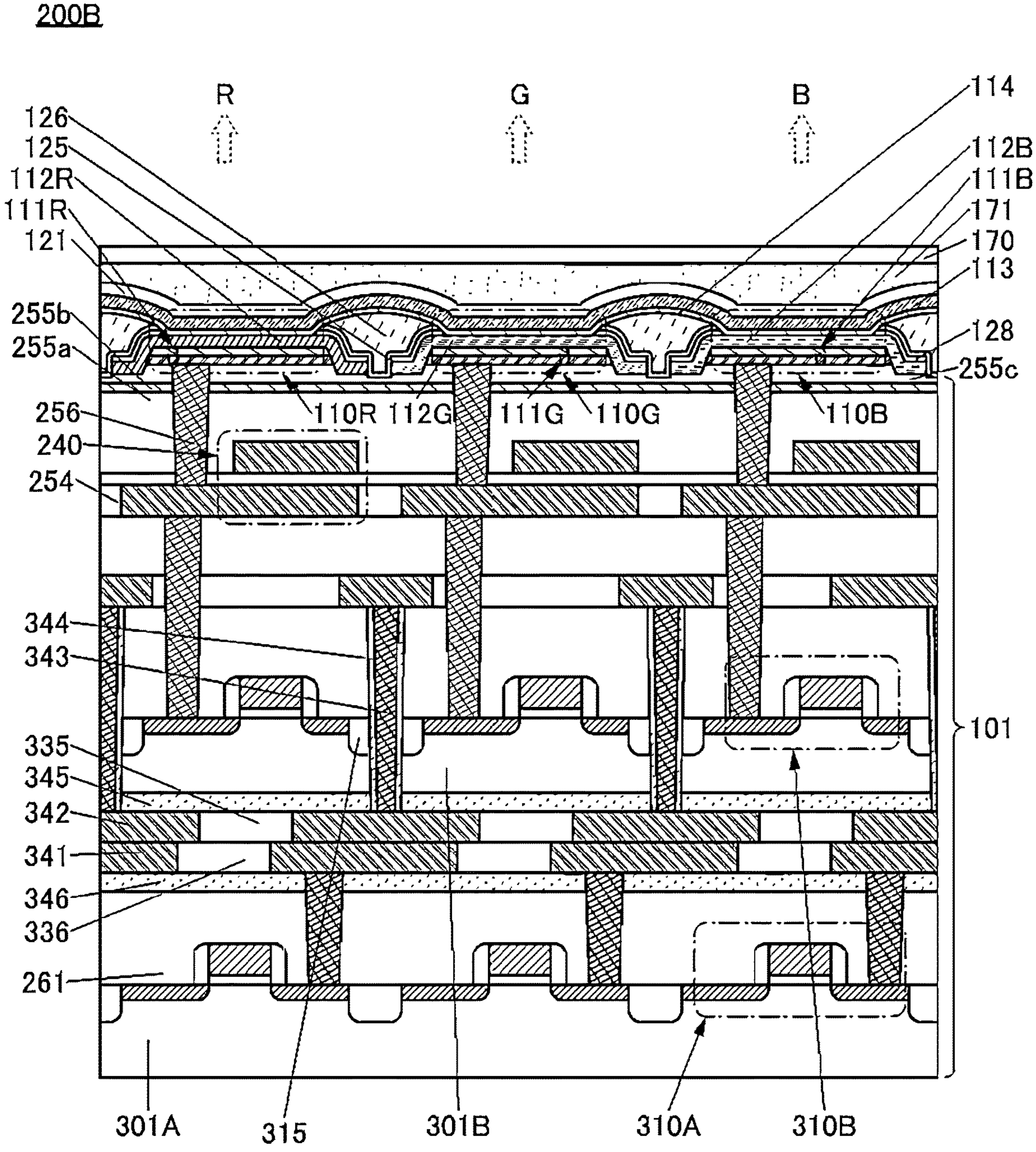
FIG. 12 is a diagram illustrating a structure example of a display panel.

The display panel 200B illustrated in FIG. 12 has a structure where transistors 310A and transistors 310B in each of which a channel is formed in a semiconductor substrate are stacked. Note that in the following description of the display panel, the description of portions similar to those of the above display panel is omitted in some cases.

The display panel 200B has a structure where a substrate 301B provided with the transistors 310B, the capacitors 240, and the light-emitting devices is attached to a substrate 301A provided with the transistors 310A.

Here, an insulating layer 345 is provided on a bottom surface of the substrate 301B, and an insulating layer 346 is provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 121 can be used.

The substrate 301B is provided with plugs 343 that penetrate the substrate 301B and the insulating layer 345. Here, insulating layers 344 each functioning as a protective layer are preferably provided to cover side surfaces of the plugs 343.

In addition, a conductive layer 342 is provided under the insulating layer 345 on the substrate 301B. The conductive layer 342 is embedded in an insulating layer 335, and bottom surfaces of the conductive layer 342 and the insulating layer 335 are planarized. Furthermore, the conductive layer 342 is electrically connected to the plug 343.

In contrast, a conductive layer 341 is provided over the insulating layer 346 over the substrate 301A. The conductive layer 341 is embedded in an insulating layer 336, and top surfaces of the conductive layer 341 and the insulating layer 336 are planarized.

The same conductive material is preferably used for the conductive layer 341 and the conductive layer 342. A metal film containing an element selected from Al, Cr, Cu, Ta, Ti, Mo, and W, a metal nitride film containing the above element as a component (a titanium nitride film, a molybdenum nitride film, or a tungsten nitride film), or the like can be used, for example. Copper is particularly preferably used for the conductive layer 341 and the conductive layer 342. Accordingly, it is possible to employ a Cu-to-Cu (copper-to-copper) direct bonding technique (a technique for achieving electrical continuity by connecting Cu (copper) pads to each other).

[Display Panel 200C]

Figure 13:
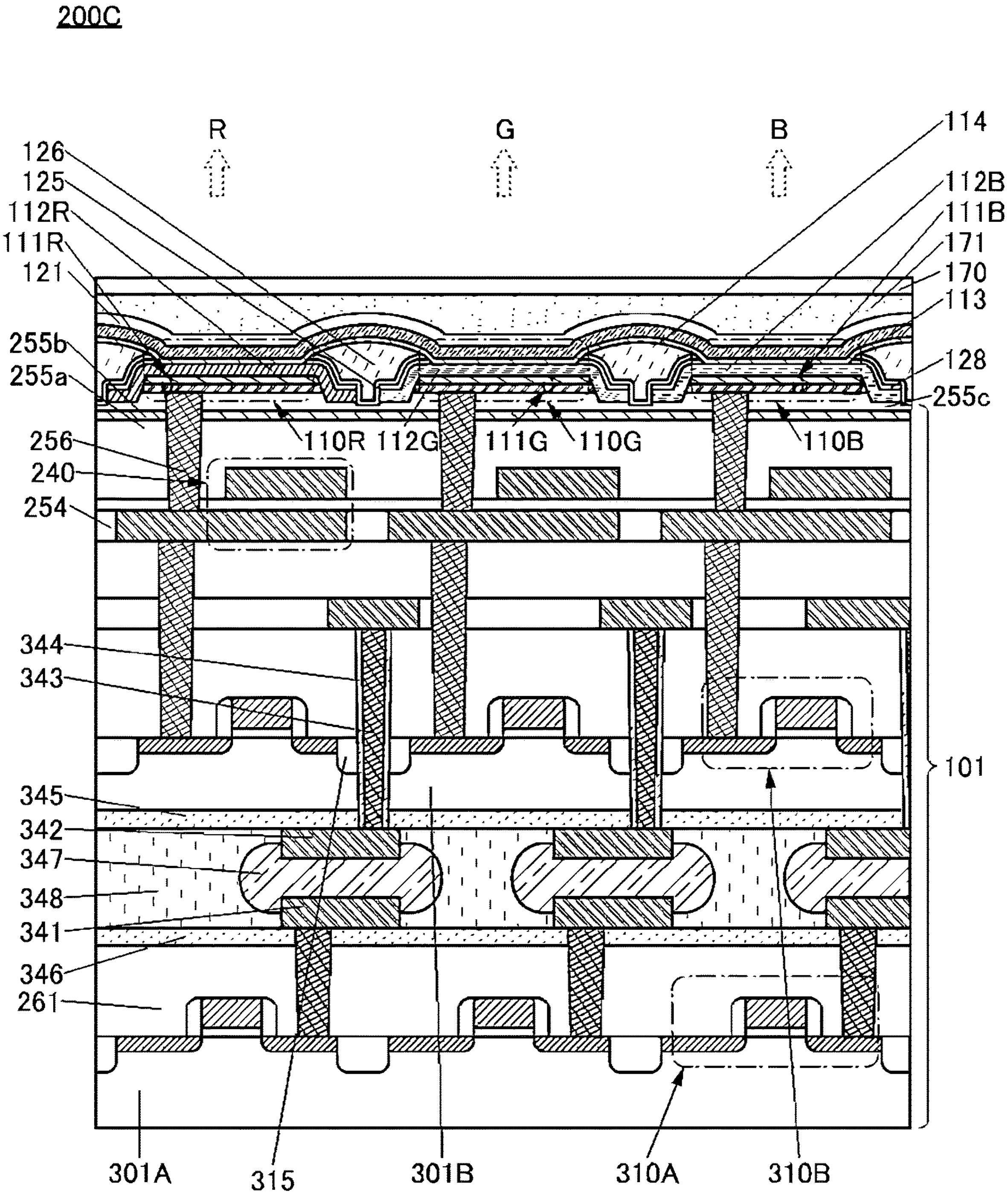
FIG. 13 is a diagram illustrating a structure example of a display panel.

The display panel 200C illustrated in FIG. 13 has a structure where the conductive layer 341 and the conductive layer 342 are bonded to each other through a bump 347.

As illustrated in FIG. 13, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder is used for the bump 347 in some cases. In addition, an adhesive layer 348 may be provided between the insulating layer 345 and the insulating layer 346. Furthermore, in the case where the bump 347 is provided, a structure without the insulating layer 335 and the insulating layer 336 may be employed.

[Display Panel 200D]

Figure 14:
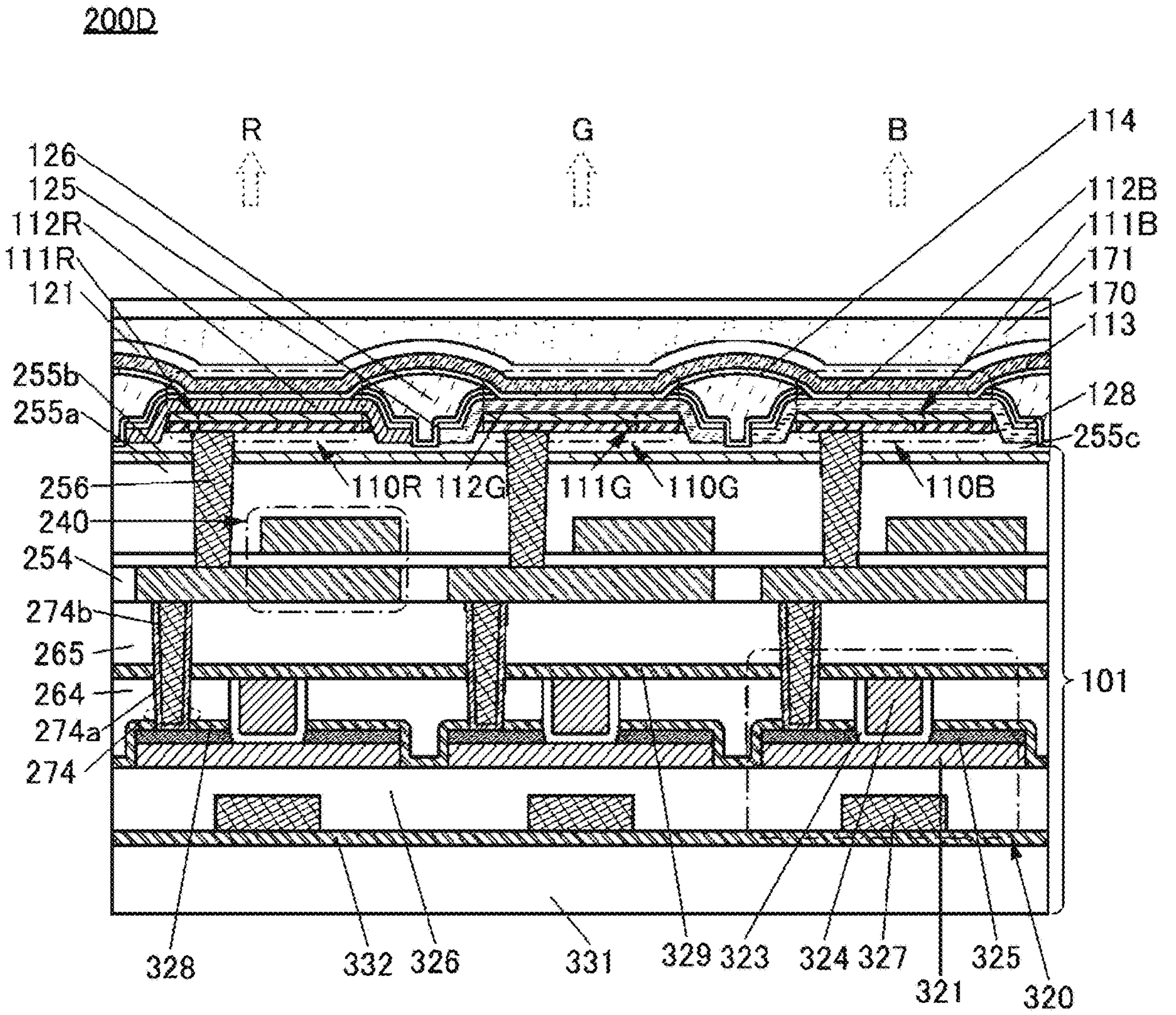
FIG. 14 is a diagram illustrating a structure example of a display panel.

The display panel 200D illustrated in FIG. 14 differs from the display panel 200A mainly in a transistor structure.

A transistor 320 is a transistor (an OS transistor) in which a metal oxide (also referred to as an oxide semiconductor) is employed in a semiconductor layer where a channel is formed. The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 10A and FIG. 10B.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a metal oxide (also referred to as an oxide semiconductor) film exhibiting semiconductor characteristics. The pair of conductive layers 325 is provided on and in contact with the semiconductor layer 321, and functions as a source electrode and a drain electrode.

An insulating layer 328 is provided to cover top surfaces and side surfaces of the pair of conductive layers 325, side surfaces of the semiconductor layer 321, and the like, and an insulating layer 264 is provided over the insulating layer 328. The insulating layer 328 functions as a barrier layer that prevents diffusion of impurities such as water or hydrogen from the insulating layer 264 or the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with a top surface of the semiconductor layer 321 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are subjected to planarization treatment so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers side surfaces of openings in the insulating layer 265, the insulating layer 329, the insulating layer 264, and the insulating layer 328 and part of a top surface of the conductive layer 325, and a conductive layer 274*b* in contact with a top surface of the conductive layer 274*a*. In that case, a conductive material in which hydrogen and oxygen are less likely to diffuse is preferably used for the conductive layer 274*a*.

Note that there is no particular limitation on the structures of the transistors included in the display panel of this embodiment. For example, a planar transistor, a staggered transistor, an inverted staggered transistor, or the like can be used. In addition, the transistor structure may be either a top-gate structure or a bottom-gate structure. Alternatively, gates may be provided above and below a semiconductor layer where a channel is formed.

A structure where the semiconductor layer where a channel is formed is sandwiched between two gates is employed for the transistor 320. The two gates may be connected to each other and supplied with the same signal to drive the transistor. Alternatively, a potential for controlling the threshold voltage may be applied to one of the two gates and a potential for driving may be supplied to the other of the two gates to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used because degradation of the transistor characteristics can be inhibited.

The bandgap of a metal oxide used for the semiconductor layer of the transistor is preferably greater than or equal to 2 eV, further preferably greater than or equal to 2.5 eV. The use of a metal oxide having a wide bandgap can reduce the off-state current of the OS transistor.

A metal oxide preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example.

Alternatively, the semiconductor layer of the transistor may contain silicon. Examples of silicon include amorphous silicon and crystalline silicon (low-temperature polysilicon, single crystal silicon, or the like).

Examples of the metal oxide that can be used for the semiconductor layer include indium oxide, gallium oxide, and zinc oxide. In addition, the metal oxide preferably contains two or three kinds selected from indium, the element M, and zinc. Note that the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. In particular, the element M is preferably one or more kinds selected from aluminum, gallium, yttrium, and tin.

It is particularly preferable that an oxide containing indium, gallium, and zinc (also referred to as IGZO) be used as the metal oxide used for the semiconductor layer. Alternatively, it is preferable to use an oxide containing indium, tin, and zinc (also referred to as ITZO (registered trademark)). Alternatively, it is preferable to use an oxide containing indium, gallium, tin, and zinc. Alternatively, it is preferable to use an oxide containing indium, aluminum, and zinc (also referred to as IAZO). Alternatively, it is preferable to use an oxide containing indium, aluminum, gallium, and zinc (also referred to as IAGZO).

When the metal oxide used for the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of a desired atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

Alternatively, the semiconductor layer may include two or more metal oxide layers having different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be suitably employed. In particular, gallium or aluminum is preferably used as the element M.

Alternatively, a stacked structure or the like of one selected from indium oxide, indium gallium oxide, and IGZO, and one selected from IAZO, IAGZO, and ITZO (registered trademark) may be used, for example.

Examples of an oxide semiconductor having crystallinity include a CAAC (c-axis aligned crystalline)-OS and an nc (nanocrystalline)-OS.

An OS transistor has extremely higher field-effect mobility than a transistor using amorphous silicon. In addition, the OS transistor has extremely low leakage current between a source and a drain in an off state (hereinafter also referred to as off-state current), and charge accumulated in a capacitor that is connected in series with the transistor can be retained for a long period. Furthermore, the power consumption of the display panel can be reduced with the use of the OS transistor.

In addition, to increase the emission luminance of the light-emitting device included in the pixel circuit, the amount of current flowing through the light-emitting device needs to be increased. To increase the current amount, the source-drain voltage of a driving transistor included in the pixel circuit needs to be increased. Since the OS transistor has higher breakdown voltage between the source and the drain than a Si transistor, high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

In addition, when transistors operate in a saturation region, a change in source-drain current relative to a change in gate-source voltage is smaller in an OS transistor than in a Si transistor. Accordingly, when an OS transistor is employed as the driving transistor included in the pixel circuit, the amount of current flowing between the source and the drain can be finely set by a change in gate-source voltage; thus, the amount of current flowing through the light-emitting device can be controlled. Therefore, the number of gray levels in the pixel circuit can be increased.

In addition, regarding saturation characteristics of current flowing when transistors operate in a saturation region, even in the case where the source-drain voltage of an OS transistor gradually increases, more stable current (saturation current) can be fed through the OS transistor than through a Si transistor. Thus, by using an OS transistor as the driving transistor, stable current can be fed through the light-emitting device even when the current-voltage characteristics of EL devices vary, for example. In other words, when the OS transistor operates in the saturation region, the source-drain current hardly changes even with an increase in the source-drain voltage; thus, the emission luminance of the light-emitting device can be stable.

As described above, with the use of an OS transistor as the driving transistor included in the pixel circuit, it is possible to achieve "inhibition of black floating," "increase in emission luminance," "increase in the number of gray levels," "inhibition of variation in light-emitting devices," and the like.

[Display Panel 200E]

Figure 15:
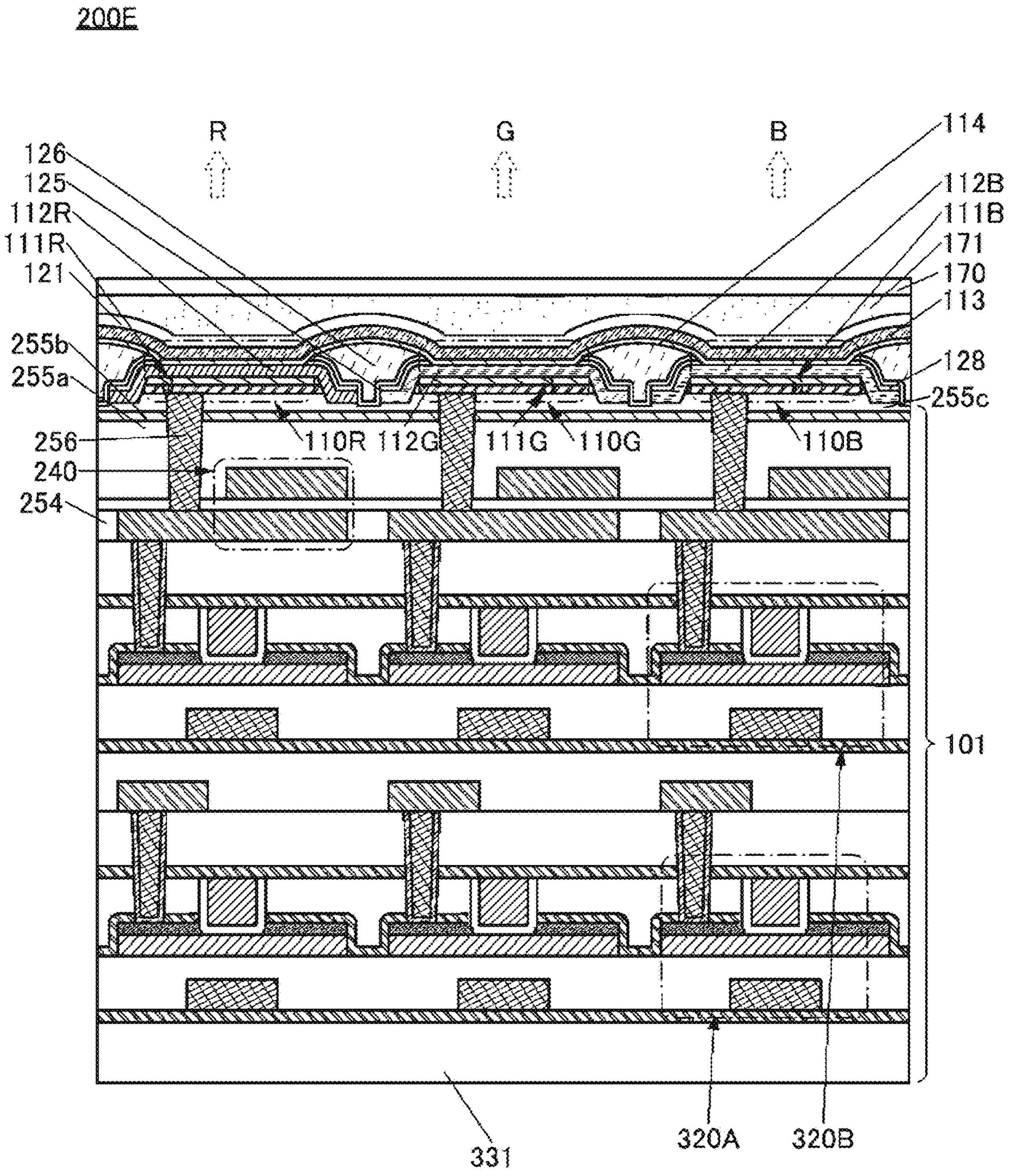
FIG. 15 is a diagram illustrating a structure example of a display panel.

The display panel 200E illustrated in FIG. 15 has a structure where a transistor 320A and a transistor 320B each including an oxide semiconductor in a semiconductor where a channel is formed are stacked.

The display panel 200D can be referred to for the transistor 320A, the transistor 320B, and other peripheral structures.

Note that although the structure where two transistors including an oxide semiconductor are stacked is described here, the present invention is not limited thereto. For example, a structure may be employed in which three or more transistors are stacked.

[Display Panel 200F]

Figure 16:
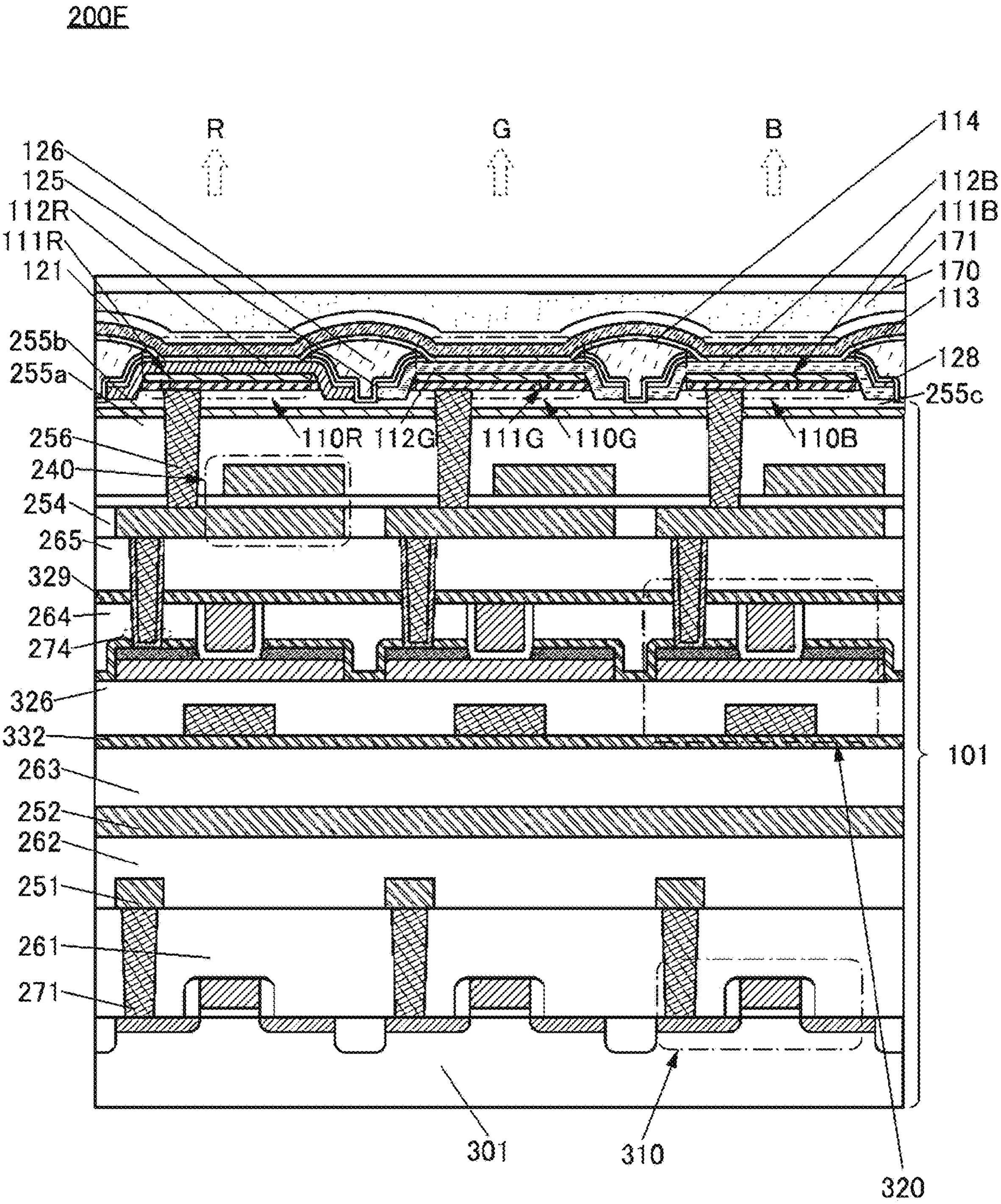
FIG. 16 is a diagram illustrating a structure example of a display panel.

The display panel 200F illustrated in FIG. 16 has a structure where the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. In addition, an insulating layer 262 is provided to cover the conductive layer 251, and a conductive layer 252 is provided over the insulating layer 262. The conductive layer 251 and the conductive layer 252 each function as a wiring. Furthermore, an insulating layer 263 and the insulating layer 332 are provided to cover the conductive layer 252, and the transistor 320 is provided over the insulating layer 332. Moreover, the insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. In addition, the transistor 310 can be used as a transistor included in the pixel circuit or a transistor included in a driver circuit (a gate line driver circuit or a source line driver circuit) for driving the pixel circuit. Furthermore, the transistor 310 and the transistor 320 can be used as transistors included in a variety of circuits such as an arithmetic circuit or a memory circuit.

With such a structure, not only the pixel circuit but also the driver circuit and the like can be formed directly under the light-emitting devices; thus, the display panel can be downsized as compared with the case where the driver circuit is provided around a display region.

[Display Panel 200G]

Figure 17:
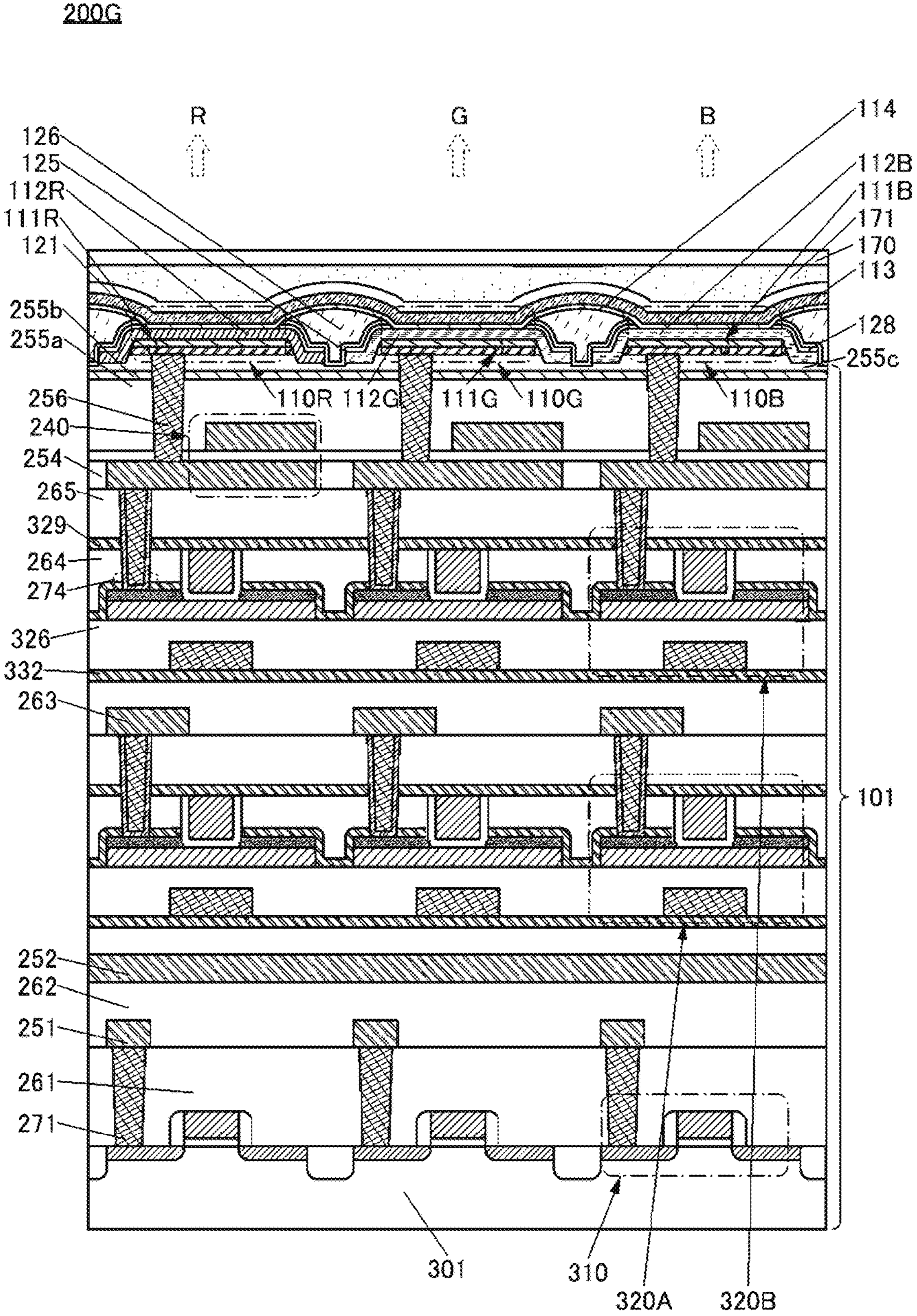
FIG. 17 is a diagram illustrating a structure example of a display panel.

The display panel 200G illustrated in FIG. 17 has a structure where the transistor 310 whose channel is formed in the substrate 301, the transistor 320A including a metal oxide in the semiconductor layer where the channel is formed, and the transistor 320B are stacked.

The transistor 320A can be used as a transistor included in the pixel circuit. In addition, the transistor 310 can be used as a transistor included in the pixel circuit or a transistor included in a driver circuit (a gate line driver circuit or a source line driver circuit) for driving the pixel circuit. The transistor 320B may be used as a transistor included in the pixel circuit or a transistor included in the driver circuit. Furthermore, the transistor 310, the transistor 320A, and the transistor 320B can be used as transistors included in a variety of circuits such as an arithmetic circuit or a memory circuit.

At least part of this embodiment can be implemented in combination with the other embodiments described in this specification as appropriate.

Embodiment 4

In this embodiment, a light-emitting device (light-emitting element) that can be used in the display panel according to one embodiment of the present invention will be described.

In this specification and the like, a device manufactured using a metal mask or an FMM (a fine metal mask or a high-definition metal mask) is sometimes referred to as a device having an MM (metal mask) structure. In addition, in this specification and the like, a device manufactured without using a metal mask or an FMM is sometimes referred to as a device having an MML (metal maskless) structure.

In this specification and the like, a structure where at least light-emitting layers of light-emitting devices having different emission wavelengths are separately formed is sometimes referred to as an SBS (Side By Side) structure. The SBS structure allows optimization of materials and structures of the light-emitting devices and thus can increase the degree of freedom in selecting the materials and the structures, which facilitates improvement in luminance and improvement in reliability.

In this specification and the like, a hole or an electron is sometimes referred to as a "carrier." Specifically, a hole-injection layer or an electron-injection layer is sometimes referred to as a "carrier-injection layer," a hole-transport layer or an electron-transport layer is sometimes referred to as a "carrier-transport layer," and a hole-blocking layer or an electron-blocking layer is sometimes referred to as a "carrier-blocking layer." Note that the carrier-injection layer, carrier-transport layer, and carrier-blocking layer cannot be distinguished from each other by cross-sectional shapes, characteristics, or the like in some cases. Furthermore, one layer has two or three functions of the carrier-injection layer, the carrier-transport layer, and the carrier-blocking layer in some cases.

In this specification and the like, a light-emitting device (also referred to as a light-emitting element) includes an EL layer between a pair of electrodes. The EL layer includes at least a light-emitting layer. Here, examples of a layer included in the EL layer (also referred to as a functional layer) include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer).

As the light-emitting device, an OLED or a QLED is preferably used, for example. Examples of a light-emitting substance contained in the light-emitting device include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (a quantum-dot material or the like). In addition, an LED such as a micro-LED can be also used as the light-emitting device.

The emission color of the light-emitting device can be infrared, red, green, blue, cyan, magenta, yellow, white, or the like. Furthermore, color purity can be increased when the light-emitting device has a microcavity structure.

Figure 18A:
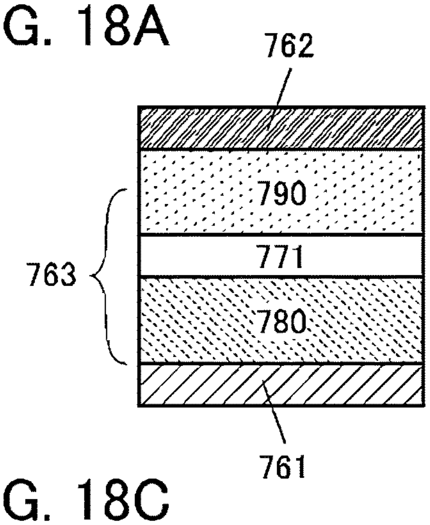
FIG. 18A to FIG. 18F are diagrams each illustrating a structure example of a light-emitting device.

As illustrated in FIG. 18A, the light-emitting device includes an EL layer 763 between a pair of electrodes (a lower electrode 761 and an upper electrode 762). The EL layer 763 can be formed using a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). Furthermore, the layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layers 780 and 790 are interchanged.

The structure including the layer 780, the light-emitting layer 771, and the layer 790 that is provided between the pair of electrodes can function as a single light-emitting unit, and the structure in FIG. 18A is referred to as a single structure in this specification.

Figure 18B:
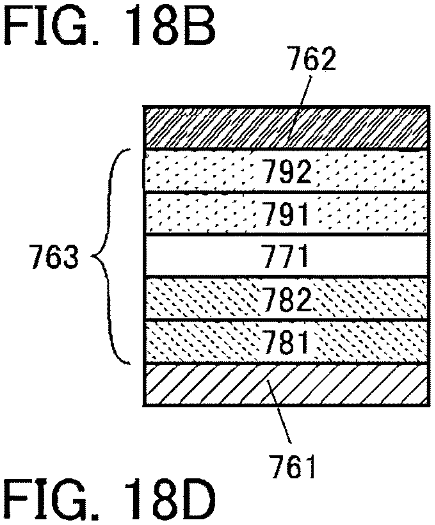

In addition, FIG. 18B is a modification example of the EL layer 763 included in the light-emitting device illustrated in FIG. 18A. Specifically, the light-emitting device illustrated in FIG. 18B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. Alternatively, in the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected to the light-emitting layer 771, and the efficiency of recombination of carriers in the light-emitting layer 771 can be increased.

Figure 18C:
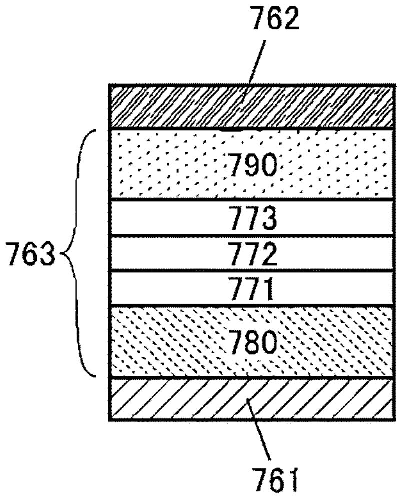
Figure 18D:
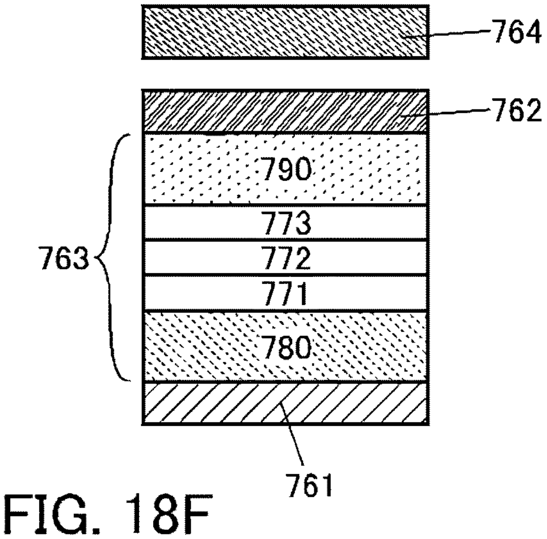

Note that structures in which a plurality of light-emitting layers (light-emitting layers 771, 772, and 773) are provided between the layer 780 and the layer 790 as illustrated in FIG. 18C and FIG. 18D are other variations of the single structure. Note that although FIG. 18C and FIG. 18D each illustrate the example where three light-emitting layers are included, the light-emitting device having the single structure may include two light-emitting layers or four or more light-emitting layers. In addition, the light-emitting device having the single structure may include a buffer layer between two light-emitting layers.

Figure 18E:
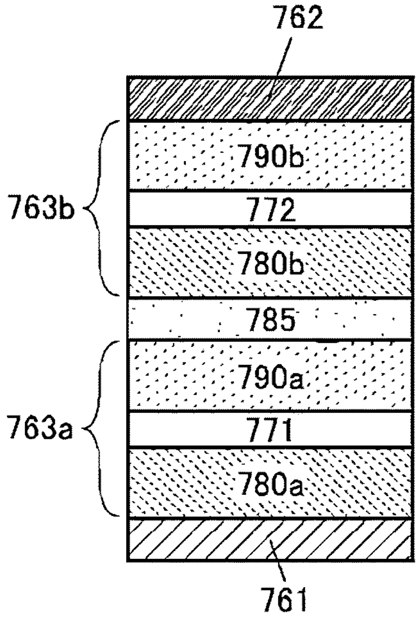
Figure 18F:
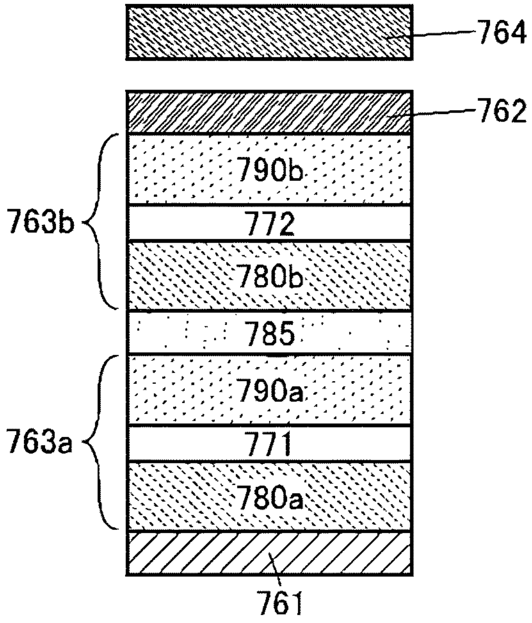

In addition, a structure where a plurality of light-emitting units (a light-emitting unit 763*a* and a light-emitting unit 763*b*) are connected in series with a charge-generation layer 785 (also referred to as an intermediate layer) therebetween as illustrated in FIG. 18E and FIG. 18F is referred to as a tandem structure in this specification. Note that the tandem structure may be referred to as a stack structure. The tandem structure enables a light-emitting device capable of light emission at high luminance. Furthermore, the tandem structure can reduce the amount of current needed for obtaining the same luminance as compared with the single structure, and thus can increase reliability.

Note that FIG. 18D and FIG. 18F each illustrate an example where the display panel includes a layer 764 overlapping the light-emitting device. FIG. 18D illustrates an example where the layer 764 overlaps the light-emitting device illustrated in FIG. 18C, and FIG. 18F illustrates an example where the layer 764 overlaps the light-emitting device illustrated in FIG. 18E.

One or both of a color conversion layer and a color filter (a coloring layer) can be used for the layer 764.

In FIG. 18C and FIG. 18D, light-emitting substances that emit light of the same color or the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. In a subpixel that emits blue light, blue light emitted from the light-emitting device can be extracted. In addition, in each of a subpixel that emits red light and a subpixel that emits green light, a color conversion layer is provided as the layer 764 illustrated in FIG. 18D, so that blue light emitted from the light-emitting device can be converted into light with a longer wavelength and thus red light or green light can be extracted.

Alternatively, light-emitting substances that emit light of different colors may be used for the light-emitting layer 771, the light-emitting layer 772, and the light-emitting layer 773. White light emission can be obtained when the emission colors of the light-emitting layer 771, the light-emitting layer 772, and the light-emitting layer 773 are complementary colors. The light-emitting device having the single structure preferably includes a light-emitting layer containing a light-emitting substance that emits blue light and a light-emitting layer containing a light-emitting substance that emits visible light with a longer wavelength than blue light, for example. In the case where the light-emitting device having the single structure includes three light-emitting layers, for example, a light-emitting layer containing a light-emitting substance that emits red (R) light, a light-emitting layer containing a light-emitting substance that emits green (G) light, and a light-emitting layer containing a light-emitting substance that emits blue (B) light are preferably included. The stacking order of the light-emitting layers can be R, G, and B from the anode side or R, B, and G from the anode side, for example. In that case, a buffer layer may be provided between R and G or between R and B.

In addition, in the case where the light-emitting device having the single structure includes two light-emitting layers, for example, a light-emitting layer containing a light-emitting substance that emits blue (B) light and a light-emitting layer containing a light-emitting substance that emits yellow light are preferably included. Such a structure is sometimes referred to as a BY single structure.

A color filter may be provided for the layer 764 illustrated in FIG. 18D. When white light passes through the color filter, light of a desired color can be obtained.

A light-emitting device that emits white light preferably contains two or more kinds of light-emitting substances. To obtain white light emission, two or more light-emitting substances are selected such that their emission colors are complementary colors. For example, when the emission color of a first light-emitting layer and the emission color of a second light-emitting layer are complementary colors, the light-emitting device can be configured to emit white light as a whole. The same applies to a light-emitting device including three or more light-emitting layers.

In addition, in FIG. 18E and FIG. 18F, light-emitting substances that emit light of the same color or the same light-emitting substance may be used for the light-emitting layer 771 and the light-emitting layer 772.

For example, in light-emitting devices included in subpixels that emit light of respective colors, a light-emitting substance that emits blue light may be used for each of the light-emitting layer 771 and the light-emitting layer 772. In a subpixel that emits blue light, blue light emitted from the light-emitting device can be extracted. In addition, in each of a subpixel that emits red light and a subpixel that emits green light, a color conversion layer is provided as the layer 764 illustrated in FIG. 18F, so that blue light emitted from the light-emitting device can be converted into light with a longer wavelength and thus red light or green light can be extracted.

Alternatively, in the case where the light-emitting device having the structure illustrated in FIG. 18E or FIG. 18F is used for the subpixels that emit light of respective colors, the subpixels may use different light-emitting substances. Specifically, in the light-emitting device included in the subpixel that emits red light, a light-emitting substance that emits red light may be used for each of the light-emitting layer 771 and the light-emitting layer 772. Similarly, in the light-emitting device included in the subpixel that emits green light, a light-emitting substance that emits green light may be used for each of the light-emitting layer 771 and the light-emitting layer 772. In the light-emitting device included in the subpixel that emits blue light, a light-emitting substance that emits blue light may be used for each of the light-emitting layer 771 and the light-emitting layer 772. A display panel having such a structure can be regarded as employing a light-emitting device with the tandem structure and the SBS structure. Thus, the display panel can have both the advantage of a tandem structure and the advantage of an SBS structure. Accordingly, a light-emitting device capable of light emission at high luminance and having high reliability can be achieved.

Alternatively, in FIG. 18E and FIG. 18F, light-emitting substances that emit light of different colors may be used for the light-emitting layer 771 and the light-emitting layer 772. White light emission can be obtained when light emitted from the light-emitting layer 771 and light emitted from the light-emitting layer 772 have complementary colors. A color filter may be provided as the layer 764 illustrated in FIG. 18F. When white light passes through the color filter, light of a desired color can be obtained.

Note that although FIG. 18E and FIG. 18F each illustrate an example where the light-emitting unit 763*a* includes one light-emitting layer 771 and the light-emitting unit 763*b* includes one light-emitting layer 772, one embodiment of the present invention is not limited thereto. Each of the light-emitting unit 763*a* and the light-emitting unit 763*b* may include two or more light-emitting layers.

In addition, although FIG. 18E and FIG. 18F each illustrate the example of the light-emitting device including two light-emitting units, one embodiment of the present invention is not limited thereto. The light-emitting device may include three or more light-emitting units.

Figure 19A:
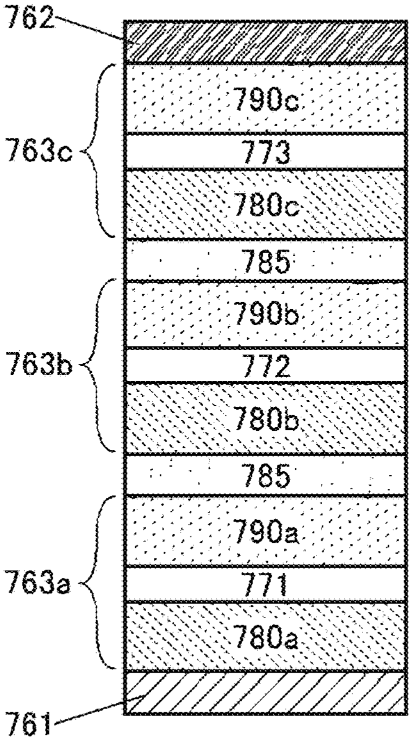
FIG. 19A to FIG. 19C are diagrams each illustrating a structure example of a light-emitting device.
Figure 19B:
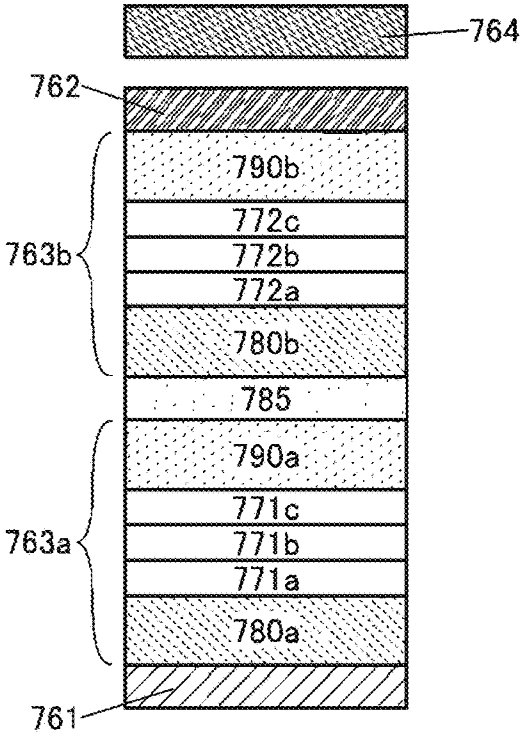
Figure 19C:
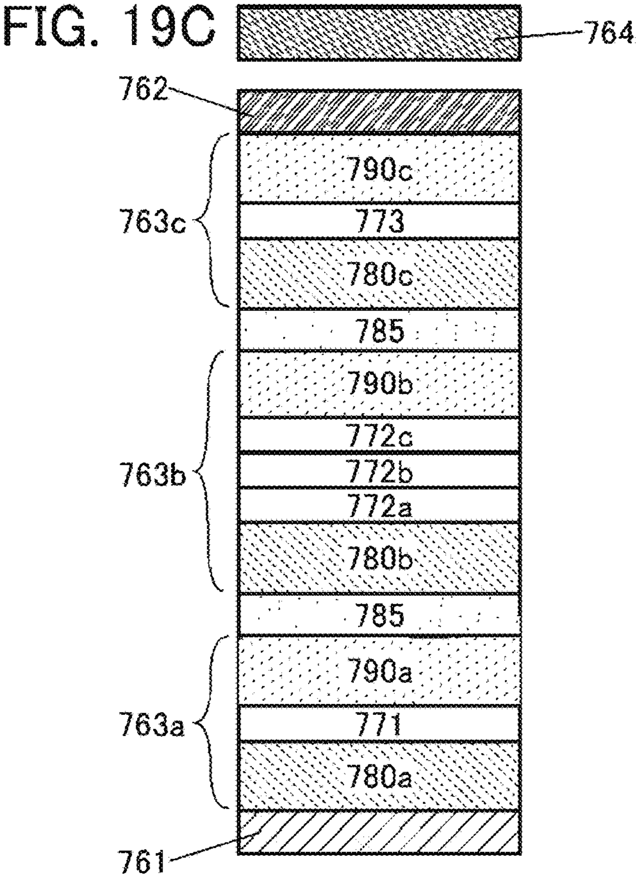

Specifically, structures of the light-emitting device illustrated in FIG. 19A to FIG. 19C can be given.

FIG. 19A illustrates a structure including three light-emitting units. Note that a structure including two light-emitting units and a structure including three light-emitting units may be referred to as a two-unit tandem structure and a three-unit tandem structure, respectively.

In addition, in the structure illustrated in FIG. 19A, a plurality of light-emitting units (the light-emitting unit 763*a*, the light-emitting unit 763*b*, and a light-emitting unit 763*c*) are connected in series with the charge-generation layers 785 therebetween. Furthermore, the light-emitting unit 763*a* includes a layer 780*a*, the light-emitting layer 771, and a layer 790*a*. The light-emitting unit 763*b* includes a layer 780*b*, the light-emitting layer 772, and a layer 790*b*. The light-emitting unit 763*c* includes a layer 780*c*, the light-emitting layer 773, and a layer 790*c*.

Note that in the structure illustrated in FIG. 19A, the light-emitting layer 771, the light-emitting layer 772, and the light-emitting layer 773 preferably contain light-emitting substances that emit light of the same color. Specifically, the light-emitting layer 771, the light-emitting layer 772, and the light-emitting layer 773 can each contain a light-emitting substance that emits red (R) light (what is called a three-unit R\R\R tandem structure), the light-emitting layer 771, the light-emitting layer 772, and the light-emitting layer 773 can each contain a light-emitting substance that emits green (G) light (what is called a three-unit G\G\G tandem structure), or the light-emitting layer 771, the light-emitting layer 772, and the light-emitting layer 773 can each contain a light-emitting substance that emits blue (B) light (what is called a three-unit B\B\B tandem structure).

Note that the structures of the light-emitting substances that emit light of the same color are not limited to the above structures. For example, a light-emitting device having a tandem structure may be employed in which light-emitting units each containing a plurality of light-emitting substances are stacked as illustrated in FIG. 19B. FIG. 19B illustrates a structure where a plurality of light-emitting units (the light-emitting unit 763*a* and the light-emitting unit 763*b*) are connected in series with the charge-generation layer 785 therebetween. In addition, the light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In the structure illustrated in FIG. 19B, a structure is employed in which light-emitting substances for the light-emitting layer 771*a*, the light-emitting layer 771*b*, and the light-emitting layer 771*c* are selected to emit light of complementary colors and white (W) light emission can be obtained. Furthermore, a structure is employed in which light-emitting substances for the light-emitting layer 772*a*, the light-emitting layer 772*b*, and the light-emitting layer 772*c* are selected to emit light of complementary colors and white (W) light emission can be obtained. That is, the structure illustrated in FIG. 19C is a two-unit W\W tandem structure. Note that there is no particular limitation on the stacking order of light-emitting substances that emit light of complementary colors in the light-emitting layer 771*a*, the light-emitting layer 771*b*, and the light-emitting layer 771*c*. A practitioner can select the optimal stacking order as appropriate. Moreover, although not illustrated, a three-unit W\W\W tandem structure or a tandem structure with four or more units may be employed.

In addition, in the case of using the light-emitting device having the tandem structure, the following structure can be given, for example: a two-unit B\Y tandem structure including a light-emitting unit that emits yellow (Y) light and a light-emitting unit that emits blue (B) light; a two-unit R·G\B tandem structure including a light-emitting unit that emits red (R) and green (G) light and a light-emitting unit that emits blue (B) light; a three-unit B\Y\B tandem structure including a light-emitting unit that emits blue (B) light, a light-emitting unit that emits yellow (Y) light, and a light-emitting unit that emits blue (B) light in this order; a three-unit B\YG\B tandem structure including a light-emitting unit that emits blue (B) light, a light-emitting unit that emits yellowish-green (YG) light, and a light-emitting unit that emits blue (B) light in this order; and a three-unit B\G\B tandem structure including a light-emitting unit that emits blue (B) light, a light-emitting unit that emits green (G) light, and a light-emitting unit that emits blue (B) light in this order.

Alternatively, a light-emitting unit containing one light-emitting substance and a light-emitting unit containing a plurality of light-emitting substances may be used in combination as illustrated in FIG. 19C.

Specifically, in the structure illustrated in FIG. 19C, a plurality of light-emitting units (the light-emitting unit 763*a*, the light-emitting unit 763*b*, and the light-emitting unit 763*c*) are connected in series with the charge-generation layers 785 therebetween. In addition, the light-emitting unit 763*a* includes the layer 780*a*, the light-emitting layer 771, and the layer 790*a*. The light-emitting unit 763*b* includes the layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

In the structure illustrated in FIG. 19C, for example, a three-unit B\R·G·YG\B tandem structure where the light-emitting unit 763*a* is a light-emitting unit that emits blue (B) light, the light-emitting unit 763*b* is a light-emitting unit that emits red (R), green (G), and yellowish-green (YG) light, and the light-emitting unit 763*c* is a light-emitting unit that emits blue (B) light can be employed.

Examples of the number of stacked light-emitting units and the order of colors from the anode side include a two-unit structure of B and Y, a two-unit structure of B and a light-emitting unit X, a three-unit structure of B, Y, and B, and a three-unit structure of B, X, and B. Examples of the number of light-emitting layers stacked in the light-emitting unit X and the order of colors from the anode side include a two-layer structure of R and Y, a two-layer structure of R and G, a two-layer structure of G and R, a three-layer structure of G, R, and G, and a three-layer structure of R, G, and R. In addition, another layer may be provided between two light-emitting layers.

Note that also in FIG. 18C and FIG. 18D, the layer 780 and the layer 790 may each independently have a stacked-layer structure of two or more layers as illustrated in FIG. 18B. In addition, in FIG. 18E and FIG. 18F, the light-emitting unit 763*a* includes the layer 780*a*, the light-emitting layer 771, and the layer 790*a*, and the light-emitting unit 763*b* includes the layer 780*b*, the light-emitting layer 772, and the layer 790*b*.

In the case where the lower electrode 761 is an anode and the upper electrode 762 is a cathode, the layer 780*a* and the layer 780*b* each include one or more of a hole-injection layer, a hole-transport layer, and an electron-blocking layer. Furthermore, the layer 790*a* and the layer 790*b* each include one or more of an electron-injection layer, an electron-transport layer, and a hole-blocking layer. In the case where the lower electrode 761 is a cathode and the upper electrode 762 is an anode, the structures of the layer 780*a* and the layer 790*a* are interchanged, and the structures of the layer 780*b* and the layer 790*b* are also interchanged.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. In addition, the layer 790*a* includes an electron-transport layer, and may further include a hole-blocking layer between the light-emitting layer 771 and the electron-transport layer. Furthermore, the layer 780*b* includes a hole-transport layer, and may further include an electron-blocking layer over the hole-transport layer. Moreover, the layer 790*b* includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. In addition, the layer 790*a* includes a hole-transport layer, and may further include an electron-blocking layer between the light-emitting layer 771 and the hole-transport layer. Furthermore, the layer 780*b* includes an electron-transport layer, and may further include a hole-blocking layer over the electron-transport layer. Moreover, the layer 790*b* includes a hole-transport layer and a hole-injection layer over the hole-transport layer, and may further include an electron-blocking layer between the light-emitting layer 772 and the hole-transport layer.

In addition, in the case of manufacturing the light-emitting device having the tandem structure, two light-emitting units are stacked with the charge-generation layer 785 therebetween.

The charge-generation layer 785 includes at least a charge-generation region. The charge-generation layer 785 has a function of injecting electrons into one of the two light-emitting units and injecting holes into the other of the two light-emitting units when voltage is applied between the pair of electrodes.

Next, materials that can be used for the light-emitting device are described.

A conductive film that transmits visible light is used for the electrode through which light is extracted, which is either the lower electrode 761 or the upper electrode 762. A conductive film that reflects visible light is preferably used for the electrode through which light is not extracted. Alternatively, in the case where the display panel includes a light-emitting device that emits infrared light, it is preferable that a conductive film that transmits visible light and infrared light be used as the electrode through which light is extracted and that a conductive film that reflects visible light and infrared light be used as the electrode through which light is not extracted.

A conductive film that transmits visible light may be used also for the electrode through which light is not extracted. In that case, the electrode is preferably placed between a reflective layer and the EL layer 763. In other words, light emitted from the EL layer 763 may be reflected by the reflective layer to be extracted from the display panel.

As a material that forms the pair of electrodes of the light-emitting device, a metal, an alloy, an electrically conductive compound, a mixture thereof, or the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing an appropriate combination of these metals. Other examples of the material include indium tin oxide (also referred to as In—Sn oxide or ITO), an In—Si—Sn oxide (also referred to as ITSO), indium zinc oxide (an In—Zn oxide), and an In—W—Zn oxide. Other examples of the material include an alloy containing aluminum (an aluminum alloy) such as an alloy of aluminum, nickel, and lanthanum (Al—Ni—La), and an alloy of silver, palladium, and copper (Ag—Pd—Cu, also referred to as APC). Other examples of the material include an element that belongs to Group 1 or Group 2 of the periodic table, which is not described above (e.g., lithium, cesium, calcium, or strontium), a rare earth metal such as europium or ytterbium, an alloy containing an appropriate combination of these elements, and graphene.

The light-emitting device preferably employs a microcavity structure. Therefore, one of the pair of electrodes of the light-emitting device is preferably an electrode having properties of transmitting and reflecting visible light (a semi-transmissive and semi-reflective electrode), and the other of the pair of electrodes of the light-emitting device is preferably an electrode having a property of reflecting visible light (a reflective electrode). When the light-emitting device has a microcavity structure, light obtained from the light-emitting layer can be resonated between the electrodes, so that light emitted from the light-emitting device can be intensified.

Note that the semi-transmissive and semi-reflective electrode can have a stacked-layer structure of a conductive layer that can be used for a reflective electrode and a conductive layer that can be used for a conductive layer having a property of transmitting visible light (also referred to as a transparent electrode).

The transparent electrode has a light transmittance higher than or equal to 40%. For example, an electrode having a visible light (light at a wavelength greater than or equal to 400 nm and less than 750 nm) transmittance higher than or equal to 40% is preferably used as the transparent electrode in the light-emitting device. The visible light reflectance of the semi-transmissive and semi-reflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. In addition, these electrodes preferably have a resistivity lower than or equal to $1\times10^{-2}$ Ωcm.

The light-emitting device includes at least a light-emitting layer. In addition, the light-emitting device may further include, as a layer other than the light-emitting layer, a layer containing a substance having a high hole-injection property, a substance having a high hole-transport property, a hole-blocking material, a substance having a high electron-transport property, an electron-blocking material, a substance having a high electron-injection property, a substance having a bipolar property (a substance having a high electron-transport property and a high hole-transport property), or the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may be contained. Each layer included in the light-emitting device can be formed by a method such as an evaporation method (including a vacuum evaporation method), a transfer method, a printing method, an inkjet method, or a coating method.

The light-emitting layer contains one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum-dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (a host material, an assist material, and the like) in addition to the light-emitting substance (guest material). As one or more kinds of organic compounds, one or both of a substance having a high hole-transport property (a hole-transport material) and a substance having a high electron-transport property (an electron-transport material) can be used. As the hole-transport material, it is possible to use a material having a high hole-transport property that can be used for the hole-transport layer and will be described later. As the electron-transport material, it is possible to use a material having a high electron-transport property that can be used for the electron-transport layer and will be described later. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination of materials is selected to form an exciplex that exhibits light emission whose wavelength is to overlap the wavelength of the lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

The hole-injection layer is a layer injecting holes from an anode to the hole-transport layer and a layer containing a material having a high hole-injection property. Examples of the material having a high hole-injection property include an aromatic amine compound and a composite material containing a hole-transport material and an acceptor material (an electron-accepting material).

As the hole-transport material, it is possible to use a material having a high hole-transport property that can be used for the hole-transport layer and will be described later.

As the acceptor material, an oxide of a metal that belongs to Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is particularly preferable because it is stable in the air, has a low hygroscopic property, and is easy to handle. Alternatively, an organic acceptor material containing fluorine can be used. Alternatively, an organic acceptor material such as a quinodimethane derivative, a chloranil derivative, and a hexaazatriphenylene derivative can be used.

For example, a material that contains a hole-transport material and the above oxide of a metal belonging to Group 4 to Group 8 of the periodic table (typically, molybdenum oxide) may be used as the material having a high hole-injection property.

The hole-transport layer is a layer transporting holes, which are injected from the anode by the hole-injection layer, to the light-emitting layer. The hole-transport layer is a layer containing a hole-transport material. For the hole-transport material, a substance having a hole mobility higher than or equal to $1\times10^{-6}$ $cm^2/Vs$ is preferable. Note that other substances can be also used as long as they have a property of transporting more holes than electrons. As the hole-transport material, a material having a high hole-transport property, such as a π-electron rich heteroaromatic compound (e.g., a carbazole derivative, a thiophene derivative, a furan derivative, or the like) or an aromatic amine (a compound having an aromatic amine skeleton), is preferable.

The electron-blocking layer is provided in contact with the light-emitting layer. The electron-blocking layer has a hole-transport property and contains a material capable of blocking electrons. The materials having an electron-blocking property among the above hole-transport materials can be used for the electron-blocking layer.

The electron-blocking layer has a hole-transport property, and thus can be also referred to as a hole-transport layer. In addition, a layer having an electron-blocking property among the hole-transport layers can be also referred to as an electron-blocking layer.

The electron-transport layer is a layer transporting electrons, which are injected from the cathode by the electron-injection layer, to the light-emitting layer. The electron-transport layer is a layer containing an electron-transport material. As the electron-transport material, a substance having an electron mobility higher than or equal to $1\times10^{-6}$ $cm^2/Vs$ is preferable. Note that other substances can be also used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a T-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. The materials having a hole-blocking property among the above electron-transport materials can be used for the hole-blocking layer.

The hole-blocking layer has an electron-transport property, and thus can be also referred to as an electron-transport layer. In addition, a layer having a hole-blocking property among the electron-transport layers can be also referred to as a hole-blocking layer.

The electron-injection layer is a layer injecting electrons from the cathode to the electron-transport layer and a layer containing a material having a high electron-injection property. As the material having a high electron-injection property, an alkali metal, an alkaline earth metal, or a compound thereof can be used. As the material having a high electron-injection property, a composite material containing an electron-transport material and a donor material (an electron-donating material) can be also used.

In addition, the difference between the LUMO level of the material having a high electron-injection property and the work function value of the material used for the cathode is preferably small (specifically, smaller than or equal to 0.5 eV).

For the electron-injection layer, an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato) lithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl) phenolatolithium (abbreviation: LiPPP), lithium oxide ($LiO_x$), or cesium carbonate can be used, for example. In addition, the electron-injection layer may have a stacked-layer structure of two or more layers. As the stacked-layer structure, for example, a structure where lithium fluoride is used for a first layer and ytterbium is provided for a second layer can be given.

The electron-injection layer may include an electron-transport material. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In addition, in general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2-(1,3-phenylene)bis[9-phenyl-1,10-phenanthroline] (abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material that can be employed for the hole-injection layer.

In addition, the charge-generation layer preferably includes a layer containing a material having a high electron-injection property. The layer can be also referred to as an electron-injection buffer layer. The electron-injection buffer layer is preferably provided between the charge-generation region and the electron-transport layer. By providing the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (lithium oxide ($Li_2O$) or the like). Alternatively, a material that can be employed for the electron-injection layer can be suitably used for the electron-injection buffer layer.

The charge-generation layer preferably includes a layer containing a material having a high electron-transport property. The layer can be also referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper (II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other by cross-sectional shapes, characteristics, or the like in some cases.

Note that the charge-generation layer may contain a donor material instead of an acceptor material. For example, the charge-generation layer may include a layer containing an electron-transport material and a donor material that can be employed for the electron-injection layer.

When the light-emitting units are stacked, provision of a charge-generation layer between two light-emitting units can inhibit an increase in drive voltage.

At least part of the structure examples, the drawings corresponding thereto, and the like described in this embodiment can be combined with the other structure examples, the other drawings corresponding thereto, and the like as appropriate.

At least part of this embodiment can be implemented in combination with the other embodiments described in this specification as appropriate.

REFERENCE NUMERALS

10: eye, 30: display apparatus, 31: display panel, 32: polarizing plate, 35: display unit, 40: optical device, 41: reflective polarizing plate, **42*a*: lens, 42*b*: lens, 42: lens, 43: optical rotator, 44: reflective polarizing plate, 45: lens, 51: retardation plate, 52: half mirror, 53: retardation plate, 54: reflective polarizing plate, 60: housing, 61: band, 70: pixel, 71: subpixel, 74: pixel array, 75: circuit, 76: circuit, 81: layer, 82: layer, 83: layer, 100*a*: display panel, 100*b*: display panel, 100W: light-emitting element, 100: display panel, 101: substrate, 110*a*: light-emitting element, 110B: light-emitting element, 110*b*: light-emitting element, 110*c*: light-emitting element, 110G: light-emitting element, 110R: light-emitting element, 110: light-emitting element, 111B: pixel electrode, 111C: connection electrode, 111G: pixel electrode, 111R: pixel electrode, 111: pixel electrode, 112B: organic layer, 112G: organic layer, 112R: organic layer, 112W: organic layer, 112: organic layer, 113: common electrode, 114: common layer, 115B: conductive layer, 115G: conductive layer, 115R: conductive layer, 115: optical adjustment layer, 116B: coloring layer, 116G: coloring layer, 116R: coloring layer, 121: protective layer, 122: insulating layer, 123: insulating layer, 124*a*: pixel, 124*b*: pixel, 125: insulating layer, 126: resin layer, 128: layer, 140: connection portion, 150: pixel, 170: substrate, 171: adhesive layer, 200A: display panel, 200B: display panel, 200C: display panel, 200D: display panel, 200E: display panel, 200F: display panel, 200G: display panel, 240: capacitor, 241: conductive layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 761: lower electrode, 762: upper electrode, 763*a*: light-emitting unit, 763*b*: light-emitting unit, 763*c*: light-emitting unit, 763: EL layer, 764: layer, 771*a*: light-emitting layer, 771*b*: light-emitting layer, 771*c*: light-emitting layer, 771: light-emitting layer, 772*a*: light-emitting layer, 772*b*: light-emitting layer, 772*c*: light-emitting layer, 772: light-emitting layer, 773: light-emitting layer, 780*a*: layer, 780*b*: layer, 780*c*: layer, 780: layer, 781: layer, 782: layer, 785: charge-generation layer, 790*a*: layer, 790*b*: layer, 790*c*: layer, 790: layer, 791: layer, and 792**: layer.

The invention claimed is:

1. An optical device comprising:
a first reflective polarizing plate;
a first lens;
an optical rotator;
a second reflective polarizing plate; and
a second lens,
wherein the first reflective polarizing plate, the first lens, the optical rotator, the second reflective polarizing plate, and the second lens are placed in this order to have a region where they overlap each other,
wherein the first lens and the optical rotator are apart from each other,
wherein the first lens is a biconvex lens,
wherein a first surface of the first reflective polarizing plate is attached to a first surface of the first lens,
wherein a first surface of the optical rotator is attached to a first surface of the second reflective polarizing plate,
wherein the first reflective polarizing plate is configured to transmit first linearly polarized light and reflect second linearly polarized light orthogonal to the first linearly polarized light, and
wherein the second reflective polarizing plate is configured to reflect third linearly polarized light obtained by 45° rotation of a polarization plane of the first linearly polarized light and transmit fourth linearly polarized light orthogonal to the third linearly polarized light.

2. The optical device according to claim 1, wherein a diameter of the first lens is larger than a diameter of the second lens.

3. The optical device according to claim 1,
wherein a second surface of the second reflective polarizing plate opposite to the first surface of the second reflective polarizing plate is attached to a first surface of the second lens.

4. The optical device according to claim 1, wherein an optical rotation degree of the optical rotator is 45°.

5. The optical device according to claim 1, wherein the second lens is a plano-convex lens.

6. The optical device according to claim 1, wherein a polarizing plate is provided to face a second surface of the first reflective polarizing plate opposite to the first surface of the first reflective polarizing plate.

7. An electronic device including a housing, the housing comprising:
a display panel;
a polarizing plate;
a first reflective polarizing plate;
a first lens;
an optical rotator;
a second reflective polarizing plate; and
a second lens,
wherein the display panel, the polarizing plate, the first reflective polarizing plate, the first lens, the optical rotator, the second reflective polarizing plate, and the second lens are placed in this order to have a region where they overlap each other,
wherein the polarizing plate and the first reflective polarizing plate are placed to be apart from each other,
wherein the first lens and the optical rotator are placed to be apart from each other,
wherein the first lens is a biconvex lens,
wherein a first surface of the first reflective polarizing plate is attached to a first surface of the first lens,
wherein a first surface of the optical rotator is attached to a first surface of the second reflective polarizing plate,
wherein the polarizing plate is configured to extract first linearly polarized light from light emitted from the display panel,
wherein the first reflective polarizing plate is configured to transmit the first linearly polarized light and reflect second linearly polarized light orthogonal to the first linearly polarized light, and
wherein the second reflective polarizing plate is configured to reflect third linearly polarized light obtained by 45° rotation of a polarization plane of the first linearly polarized light and transmit fourth linearly polarized light orthogonal to the third linearly polarized light.

8. The electronic device according to claim 7, wherein a display surface of the display panel is attached to a first surface of the polarizing plate.

9. The electronic device according to claim 7, wherein a diameter of the first lens is larger than a diameter of the second lens.

10. The electronic device according to claim 7,
wherein a second surface of the second reflective polarizing plate opposite to the first surface of the second reflective polarizing plate is attached to a first surface of the second lens.

11. The electronic device according to claim 7, wherein an optical rotation degree of the optical rotator is 45°.

12. The electronic device according to claim 7, wherein the second lens is a plano-convex lens.

* * * * *